US005607809A

United States Patent [19]

Nakamura et al.

[11] Patent Number: 5,607,809

[45] Date of Patent: Mar. 4, 1997

[54] IMAGE RECEIVING SHEET AND IMAGE FORMING METHOD

[75] Inventors: Hideyuki Nakamura; Akihiko Takeda; Tomizo Namiki, all of Shizuoka, Japan

[73] Assignee: Fuji Photo Film Co., Ltd., Kanagawa, Japan

[21] Appl. No.: 514,084

[22] Filed: Aug. 11, 1995

[30] Foreign Application Priority Data

| | | | |
|---|---|---|---|
| Aug. 22, 1994 | [JP] | Japan | 6-196525 |
| Oct. 28, 1994 | [JP] | Japan | 6-265181 |
| Nov. 21, 1994 | [JP] | Japan | 6-286364 |
| May 18, 1995 | [JP] | Japan | 7-119874 |

[51] Int. Cl.$^6$ .............................. G03C 8/56; G03C 11/12; G03F 7/42

[52] U.S. Cl. .......................... 430/201; 430/200; 430/257; 430/941; 503/227

[58] Field of Search ................................... 430/200, 201, 430/203, 213, 941, 257; 503/227

[56] References Cited

U.S. PATENT DOCUMENTS

| | | | |
|---|---|---|---|
| 3,709,690 | 1/1973 | Cohen et al. | 430/941 |
| 3,721,558 | 3/1973 | Abbott | 430/941 |
| 3,985,565 | 10/1976 | Gabrielsen et al. | 430/203 |
| 4,124,386 | 11/1978 | Yoshida et al. | 430/941 |
| 4,783,375 | 11/1988 | Hashimoto et al. | 428/480 |
| 5,071,502 | 12/1991 | Hashimoto et al. | 156/234 |
| 5,232,817 | 8/1993 | Kawakima et al. | 430/201 |
| 5,300,398 | 4/1994 | Kaszczuk | 430/201 |

*Primary Examiner*—Richard L. Schilling
*Attorney, Agent, or Firm*—Birch, Stewart, Kolasch & Birch, LLP

[57] ABSTRACT

Disclosed is image receiving sheet having a support sheet, a first image receiving layer thereon and a second image receiving layer provided on the first image receiving layer; wherein the second image receiving layer comprises butyral resin and polymer having at least one of recurring units represented by the following formula:

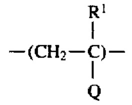

wherein $R^1$ represents a hydrogen atom or a methyl group; and Q represents a group having amide bond, a nitrogen-containing heterocyclic group, or a phenyl group substituted with residue of ammonium salt. Further, a thermal transfer recording methods by area gradation using a heat sensitive ink sheet and the image receiving sheet are also disclosed.

12 Claims, 3 Drawing Sheets

IMAGE RECEIVING SHEET AND IMAGE FORMING METHOD

FIELD OF THE INVENTION

This invention relates to an image forming method and an image receiving sheet favorably employable for the image forming method. In more detail, the invention relates to an image forming method for forming a multicolor image on the image receiving sheet by area gradation using a thermal head or laser beam.

BACKGROUND OF THE INVENTION

Heretofore, there have been known two methods for thermal transfer recording for the preparation of a multicolor image which utilize a thermal head printer, that is, a sublimation dye transfer recording and a fused ink transfer recording.

The sublimation dye transfer recording method comprises the steps of superposing on an image receiving sheet a transfer sheet which is composed of a support and a transfer layer comprising a sublimation ink and a binder and imagewise heating the support of the transfer sheet to sublimate the sublimation ink to form an image on the image receiving sheet. A multicolor image can be prepared using a number of color transfer sheets such as a yellow transfer sheet, a magenta transfer sheet, and a cyan transfer sheet.

The sublimation dye transfer recording, however, has the following drawbacks:

1) The gradation of image is mainly formed of variation of the sublimated dye concentration, which is varied by controlling the amount of sublimation of the dye. Such gradation is appropriate for the preparation of a photographic image, but is inappropriate for the preparation of a color proof which is utilized in the field of printing and whose gradation is formed of dots, lines, or the like, that is, area gradation.
2) The image formed of sublimated dye has poor edge sharpness, and a fine line shows thinner density on its solid portion than a thick line. Such tendency causes serious problem in the quality of character image.
3) The image of sublimated dye is poor in endurance. Such image cannot be used in the fields which require multicolor images resistant to heat and light.
4) The sublimation dye transfer recording shows sensitivity lower than the fused ink transfer recording. Such low sensitive recording method is not preferably employable in a high speed recording method utilizing a high resolution thermal head, of which development is expected in the future.
5) The recording material for the sublimation dye transfer recording is expensive, as compared with the recording material for the fused ink transfer recording.

The fused ink transfer recording comprises the steps of superposing on an image receiving sheet a transfer sheet having support and a thermal fusible transfer layer which comprises a coloring material (e.g., pigment or dye) and imagewise heating the support of the transfer sheet to portionwise fuse the transfer layer to form an image on the image receiving sheet. A multicolor image also can be prepared using a number of color transfer sheets.

The fused ink transfer recording is advantageous in the sensitivity, cost, and endurance of the formed image, as compared with the sublimation dye transfer recording method. It, however, has the following drawbacks:

The color image prepared by the fused ink transfer recording is poor in its quality, as compared with the sublimation dye transfer recording. This is because the fused ink transfer recording utilizes not gradation recording but binary (i.e., two valued) recording. Therefore, there have been reported a number of improvements on the fusible ink layer of the fused ink transfer recording for modifying the binary recording to give a gradation recording so that a color image having multi-gradation is prepared by the fused ink transfer recording. The basic concept of the heretofore reported improvement resides in portionwise (or locally) controlling the amount of the ink to be transferred onto the image receiving sheet. In more detail, the mechanism of transfer of the ink in the fused ink transfer recording is as follows; under heating by means of the thermal head, the viscosity of the ink layer at the site in contact with the thermal head lowers and the ink layer tends to adhere to the image receiving sheet, whereby the transfer of the ink takes place. Therefore, the amount of the transferred ink can be controlled by varying elevation of temperature on the thermal head so that the cohesive failure in the ink layer is controlled and the gamma characteristic of the transferred image is varied. Thus, the optical density of the transferred ink image is portionwise varied, and accordingly, an ink image having gradation is formed. However, the optical density of a fine line produced by the modified fused ink transfer recording is inferior to that produced by the sublimation dye transfer recording method. Moreover, the optical density of a fine line produced by the modified fused ink transfer recording method is not satisfactory.

Further, the fused ink transfer recording has other disadvantageous features such as low resolution and poor fixation of the transferred ink image. This is because the ink layer generally uses crystalline wax having a low melting point as the binder, and the wax tends to spread on the receiving sheet in the course of transferring under heating. Furthermore, the crystalline wax scarcely gives a transparent image due to light scattering on the crystalline phase. The difficulty in giving a transparent image causes serious problems in the preparation of a multicolor image which is formed by superposing a yellow image, a magenta image, and a cyan image. The requirement to the transparency of the formed image restricts the amount of a pigment to be incorporated into the ink layer. For instance, Japanese Patent Publication No. 63(1988)-65029 describes that the pigment (i.e., coloring material) should be incorporated in the ink layer in an amount of not more than 20 weight % based on the total amount of the ink layer. If an excessive amount of the pigment is employed, the transparency of the transferred ink image is made dissatisfactory. Further, the Publication also disclosed continuous gradation recording by binary or multi-valued recording.

Improvements of reproduction of a multicolor image in the fused ink transfer recording method have been studied and proposed, so far. However, the study of the inventors have clarified that recording by the continuous gradation using the proposed heat sensitive recording material does not give an image having satisfactory continuity and stability of density. Further, the binary or multi-valued recording (i.e., image recording method utilizing multi-dots having different area one another; VDS (Variable Dot System)) using the heat sensitive recording material does not give an image having satisfactory continuity of density, transparency (especially transparency of multicolor image) and sharpness in edge portion.

In contrast, it is known that a thermal transfer recording can prepare a multicolor image having multi-gradation by means of the multi-valued recording which utilizes area gradation. Further, it is also known that a heat sensitive ink sheet which can be used in the multi-valued recording utilizing area gradation, preferably have the following characteristics:

(1) Each color image (i.e., cyan image, magenta image or yellow image) of the multicolor image for color proofing should has a reflection density of at least 1.0, preferably not less than 1.2, and especially not less than 1.4, and a black image preferably has a reflection density of not less than 1.5. Thus, it is desired that the heat sensitive ink sheet has the above reflection densities.

(2) An image which is produced by area gradation is satisfactory.

(3) An image can be produced in the form of dot, and the formed line or point has high sharpness in the edge.

(4) An ink layer (image) transferred has high transparency.

(5) An ink layer has high sensitivity.

(6) An image transferred onto a white paper sheet (e.g., coated paper) is extremely near to a printed image in tone and surface gloss.

In contrast, various image receiving materials (sheets) where an image formed in the heat sensitive ink sheet is transferred, are also proposed. For example, when the fused ink transfer recording is conducted using a plain paper sheet as the image receiving material, the resultant image shows defects such as unevenness in transferred area and lack of dots due to poor smoothness or ink-receiving property of a surface of the paper sheet. As image receiving materials almost free from these defects, there are known a synthetic paper, a synthetic resin film and a whit pigment containing paper.

In color proof where an image of heat sensitive ink material transferred on the image receiving sheet is further retransferred on a white paper sheet used for printing, it is required that an image transferred onto a white paper sheet is extremely near to a printed image in tone and surface gloss. However, use of the above image receiving material cannot give such an image.

As an image receiving sheet suitable for preparing the color proof, an image receiving sheet having two image receiving layers on a support sheet is disclosed in Japanese Patent Provisional Publication No. 2(1990)-244147). A first image receiving layer on the support sheet comprises polyamide or butyral resin, and a second image receiving layer provided on the first image receiving layer comprises a polymer such as poly vinyl chloride or vinyl chloride/vinyl acetate copolymer having softening point of not higher than 150° C. and degree of polymerization of 200 to 2,000. The first image receiving layer functions in such a manner that an image of a heat sensitive ink material is easily and precisely transferred onto the image receiving sheet, and the layer is left on the support sheet after retransferring of the image. The second image receiving layer is transferred onto a white paper sheet together with an image of a heat sensitive ink material.

However, the resultant image using the image receiving sheet is not sufficiently satisfactory in formation of dot having appropriate size and shape and good reproduction of gradation, and the image is further is not sufficiently near to a printed image. Further, a surface of the image occasionally shows tackiness or sticking (sticking on other material such as sheet).

As for the thermal head printer, the technology has been very rapidly developed. Recently, the thermal head is improved to give a color image with an increased resolution and multi-gradation which is produced by area gradation. The area gradation means gradation produced not by variation of optical density in the ink area but by size of ink spots or lines per unit area. Such technology is described in Japanese Patent Provisional Publications No. 4(1992)-19163 and No. 5(1993)-155057 (for divided sub-scanning system) and the preprint of Annual Meeting of Society of Electrography (Jul. 6, 1992) (for heat concentrated system).

As a image forming method by transfer using the heat sensitive ink sheet, recently a method by means of laser beam (i.e., digital image forming method) has been developed. The method comprises the steps of: superposing the heat sensitive ink layer of the heat sensitive ink sheet on an image receiving sheet, and irradiating a laser beam modulated by digital signal on the heat sensitive ink layer through the support of the heat sensitive ink sheet to form and transfer an image of the heat sensitive ink layer on the image receiving sheet (the image can be further retransferred onto other sheet). In the method, the heat sensitive ink sheet generally has a light-heat conversion layer provided between the ink layer and the support to efficiently convert light energy of laser beam into heat energy. The light-heat conversion layer is a thin layer made of carbon black or metal. Further, a method for locally peeling the ink layer to transfer the peeled ink layer onto the image receiving sheet (i.e., ablation method), which does not fuse the layer in the transferring procedure, is utilized in order to enhance image quality such as evenness of reflection density of the image or sharpness in edge of the image.

SUMMARY OF THE INVENTION

An object of the invention is to provide an image receiving sheet employed for image forming method giving an image which has dots having preferable size and shape (i.e., near to predetermined size and shape) and good reproduction of gradation and which is extremely near to a printed image.

Another object of the invention is to provide an image receiving sheet employed for image forming method giving an image almost free from occurrence of adhesion or sticking, the image being obtained by retransferring the image transferred onto the image receiving sheet onto a white paper sheet.

Further object of the invention is to provide an image forming method which uses the image receiving sheet.

There is provided by the present invention an image receiving sheet comprising a support sheet, a first image receiving layer thereon and a second image receiving layer provided on the first image receiving layer;

wherein the second image receiving layer comprises butyral resin and polymer having at least one of recurring units represented by the following formula (1):

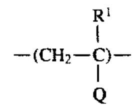

(1)

wherein $R^1$ represents a hydrogen atom or a methyl group; and Q represents:

—$CONR^2R^3$, in which each of $R^2$ and $R^3$ independently represents a hydrogen atom, an alkyl group of 1 to 18 carbon atoms, an alkyl group of 1 to 18 carbon atoms which is substituted with at least one group or atom selected from the group consisting of hydroxyl, alkoxy of 1 to 6 carbon atoms, acetamide, halogen and cyano, an aryl group of 6 to 20 carbon atoms, an aryl group of 6 to 20 carbon atoms which is substituted with at least one group or atom selected from the group consisting of hydroxyl, alkoxy of 1 to 6 carbon atoms, halogen and cyano, an acyl group of 2 to 6 carbon atoms, a phenylsulfonyl group, a phenylsulfonyl group which is substituted with alkyl of 1 to 6 carbon atoms; or $R^2$ and $R^3$ is combined together with the nitrogen atom to form a 5–7 membered heterocyclic group;

a nitrogen-containing heterocyclic group; or a group having the formula (II):

(II)

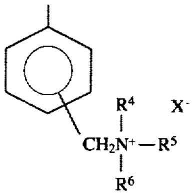

in which each of $R^4$, $R^5$ and $R^6$ independently represents an alkyl group of 1 to 25 carbon atoms, an alkyl group of 1 to 25 carbon atoms which is substituted with at least one group or atom selected from the group consisting of hydroxyl, alkoxy of 1 to 6 carbon atoms, halogen and cyano, an aralkyl group of 7 to 25 carbon atom, an aralkyl group of 7 to 25 carbon atoms which is substituted with at least one group or atom selected from the group consisting of hydroxyl, alkoxy of 1 to 6 carbon atoms, halogen and cyano, an aryl group of 6 to 25 carbon atoms, or an aryl group of 6 to 25 carbon atoms which is substituted with at least one group or atom selected from the group consisting of hydroxyl, alkoxy of 1 to 6 carbon atoms, halogen and cyano; and $X^-$ represents $Cl^-$, $Br^-$ or $I^-$.

The preferred embodiments of the above-mentioned image receiving sheet are as follows:

1) The image receiving sheet wherein the first image receiving layer contains plasticizer having molecular weight of not less than 1,000 and has Young's modulus of 10 to 10,000 kg·f/cm$^2$ at room temperature.

The image receiving sheet can be employed in combination with the heat sensitive ink sheet which comprises a support sheet and a heat sensitive ink layer having a thickness of 0.2 to 1.0 μm which is formed of a heat sensitive ink material comprising 30 to 70 weight % of colored pigment, 25 to 60 weight % of amorphous organic polymer having a softening point of 40° to 150° C. (preferably and 0.1 to 20 weight % of nitrogen-containing compound).

There is also provided by the present invention a composite wherein the heat sensitive ink sheet described above and the image receiving sheet described above were superposed in a such a manner that the heat sensitive ink layer of the heat sensitive ink material is in contact with the second image receiving layer of the image receiving sheet.

Further, there is provided by the present invention a thermal transfer recording method which comprises the steps of:

superposing the heat sensitive ink sheet comprising a support sheet and a heat sensitive ink layer thereon formed of heat sensitive ink material on the second image receiving layer of the image receiving sheet described above;

placing imagewise a thermal head on the support of the heat sensitive ink sheet to form an image of the ink material with area gradation on the image receiving sheet;

separating the support of the heat sensitive ink sheet from the image receiving sheet so that the image of the ink material is retained on the second image receiving layer;

superposing the image receiving sheet on a white paper sheet in such a manner that the image of the ink material is in contact with a surface of the white paper sheet; and separating the image receiving sheet from the white paper sheet, keeping the image of the ink material having the second image receiving layer on the white paper sheet, said image of the ink material on the white paper sheet having an optical reflection density of at least 1.0.

In the method, a white paper sheet can be employed instead of the image receiving sheet, and in this case thereafter two steps were not done.

There is further provided by the present invention a thermal transfer recording method which comprises the Steps of:

superposing the heat sensitive ink sheet comprising a support sheet and a heat sensitive ink layer thereon formed of heat sensitive ink material on the second image receiving layer of the image receiving sheet described above;

irradiating a laser beam modulated by digital signals on the heat sensitive ink layer through the support of the heat sensitive ink sheet to form an image of the ink material on the image receiving sheet;

separating the support of the heat sensitive ink sheet from the image receiving sheet so that the image of the heat sensitive ink material is retained on the second image receiving layer;

superposing the image receiving sheet on a white paper sheet in such a manner that the image of the ink material is in contact with a surface of the white paper sheet; and separating the image receiving sheet from the white paper sheet, keeping the image of the ink material having the second image receiving layer onto the white paper sheet, said image of the ink material on the white paper sheet having an optical reflection density of at least 1.0.

In the method, a white paper sheet can be employed instead of the image receiving sheet, and in this case thereafter two steps were not done.

Further, after irradiation of a laser beam, transfer of the image of the heat sensitive ink material onto the image receiving sheet is preferably done through an ablation of the image from the support of the heat sensitive ink sheet.

The methods of the invention can be utilized advantageously in preparation of a color proof of full color type.

In more detail, the preparation of a color proof can be performed by the steps:

superposing a first heat sensitive ink sheet (such as a cyan ink sheet) ion an image receiving sheet;

placing imagewise a thermal head on the support of the first heat sensitive ink sheet to form and transfer a color image (cyan image) of the heat sensitive ink material onto the image receiving sheet;

separating the support of the ink sheet from the image receiving sheet so that the color image (cyan image) of the heat sensitive ink material is retained on the second image receiving layer;

superposing a second heat sensitive ink sheet (such as a magenta ink sheet) on the image receiving sheet having the cyan image thereon;

placing imagewise a thermal head on the support of the second heat sensitive ink sheet to form and transfer a color image (magenta image) of the heat sensitive ink material onto the image receiving sheet;

separating the support of the ink sheet from the image receiving sheet so that the color image (magenta image) of the heat sensitive ink material is retained on the image receiving sheet;

superposing a third heat sensitive ink sheet (such as a yellow ink sheet) on the image receiving sheet having the cyan image and magenta image thereon;

placing imagewise a thermal head on the support of the second heat sensitive ink sheet to form and transfer a color image (yellow image) of the heat sensitive ink material onto the image receiving sheet;

separating the support of the ink sheet from the image receiving sheet so that the color image (yellow image) of the heat sensitive ink material is retained on the image receiving sheet, whereby a multicolor image is formed on the second image receiving layer; and transferring thus prepared multicolor image together with the second image receiving layer onto a white paper sheet.

Use of the image receiving sheet containing the nitrogen-containing particular polymer compound, which is advantageously employed for the image forming method giving an image, enables to give an image which has dots having preferable size and shape and good reproduction of gradation. Further, use of the image receiving sheet gives an image almost free from occurrence of adhesion or sticking and therefore the image is extremely near to a printed image.

Hence, the image receiving sheet of the invention can be advantageously utilized for preparing color proof.

Figure 1:
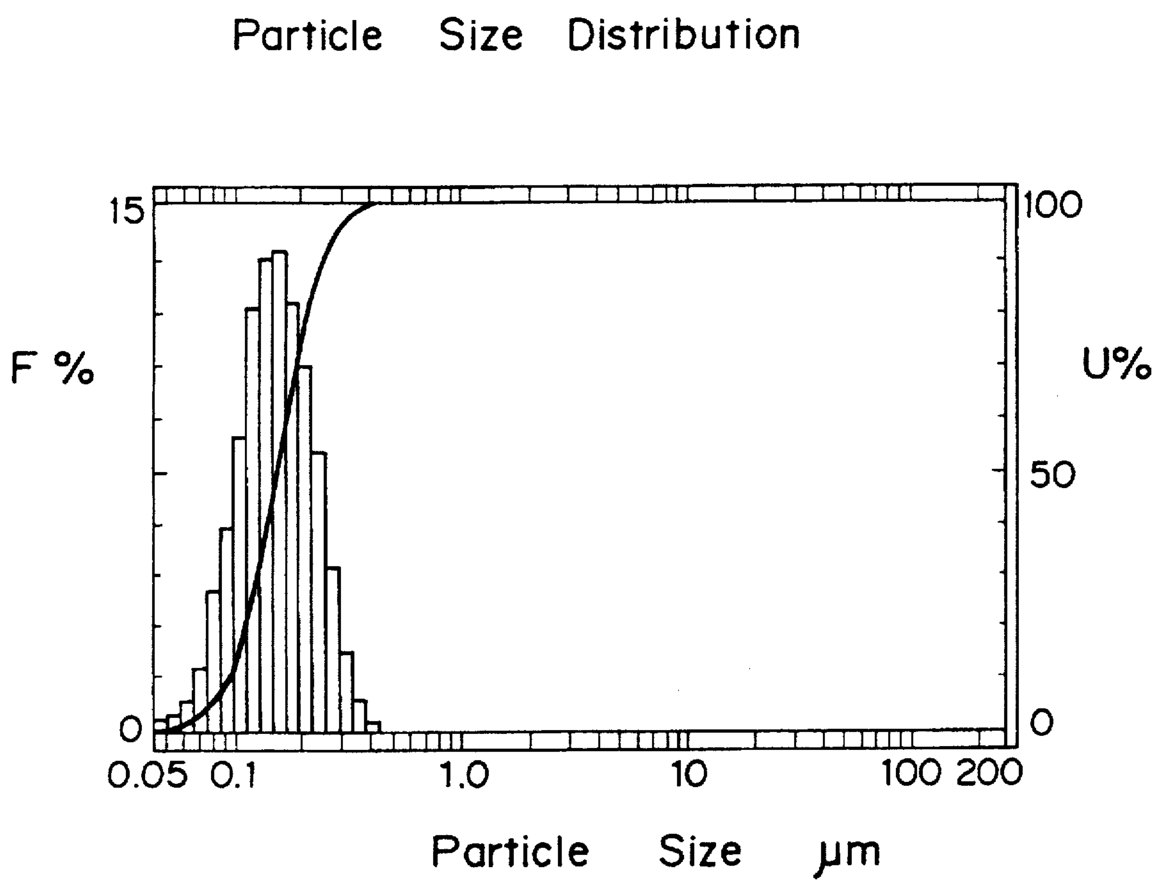
FIG. 1 shows a particle size distribution of cyan pigment employed in Example 1.

In each figure, the axis of abscissas indicates particle size (μm), the left axis of ordinates indicates percentage (%) of particles of the indicated particle sizes, and the right axis of ordinates indicates accumulated percentage (%).

DETAILED DESCRIPTION OF THE INVENTION

The image receiving sheet is advantageously employed in the image forming method of the invention by area gradation is described below.

The image receiving sheet generally has a support sheet, a first image receiving layer thereon and a second image receiving sheet provided on the first image receiving sheet.

The support sheet of the image receiving sheet is made of material having chemical stability and thermostability and flexibility. If desired, the support is required to have a large transmittance at a wavelength of the light source using for the exposure. Examples of materials of the support include polyesters such as polyethylene terephthalate (PET); polycarbonates; polystyrenes; cellulose derivatives such as cellulose triacetate, nitrocellulose and cellophane; polyolefins such as polyethylene and polypropylene; polyacrylonitrile; polyvinyl chloride; polyvinylidene chloride; polyacrylates such as PMMA (polymethyl methacrylate), polyamides such as nylon and polyimide. Further, a paper sheet that polyethylene film is laminated may be employed. Preferred is polyethylene terephthalate. The support preferably is diaxially stretched polyethylene terephthalate film. The thickness of the support is generally in the range of 5 to 300 μm, and preferably in the range of 25 to 200 μm.

On the support sheet, a first image receiving layer provided.

The first image receiving layer generally has Young's modulus of 10 to 10,000 kg·f/cm$^2$ at room temperature. Use of polymer having low Young's modulus gives cushioning characteristics to the image receiving layer, whereby transferring property is improved to give high recording sensibility, dot of good quality and satisfactory reproducibility of gradation. Further, even if dust or dirt is present between the heat sensitive ink sheet and the image receiving sheet which are superposed for recording, the recorded image (transferred image) hardly has any defect due to the cushioning characteristics of the first image receiving sheet. Furthermore, when the image transferred onto the image receiving sheet is retransferred onto a white paper sheet for printing by applying pressure and heat, the retransferring is conducted while the first image receiving layer cushions variation of pressure depending upon unevenness of a surface of the white paper sheet. Therefore, the image retransferred shows high bonding strength to the white paper sheet.

Young's modulus of the first image receiving layer preferably is 10 to 200 kg·f/cm$^2$ at room temperature. The first image receiving layer having Young's modulus of 10 to 200 kg·f/cm$^2$ shows excellent cushioning characteristics in the thickness of not more than 50 μm, and also shows good coating property. The first image receiving layer having Young's modulus of more than 10,000 kg·f/cm$^2$ shows poor cushioning characteristics and therefore needs extremely large thickness to improve cushioning characteristics. The first image receiving layer having Young's modulus of less than 10 kg·f/cm$^2$ shows tackiness on the surface, and therefore preferred coating property cannot be obtained.

Examples of polymer materials employed in the first image receiving layer include polyolefins such as polyethylene and polypropylene; copolymers of ethylene and other monomer such as vinyl acetate or acrylic acid ester; polyvinyl chloride; copolymers of vinyl chloride and other monomer such vinyl acetate or vinyl alcohol; copolymer of vinyl acetate and maleic acid; polyvinylidene chloride; copolymer containing vinylidene chloride; polyacrylate; polymethacrylate; polyamides such as copolymerized nylon and N-alkoxymethylated nylon; synthetic rubber; and chlorinated rubber. Preferred are polyvinyl chloride, copolymer of vinyl chloride and vinyl acetate, copolymer of vinyl chloride and vinyl alcohol and copolymer of vinyl acetate and maleic acid. The degree of polymerization preferably is in the range of 200 to 2,000.

The above preferred polymers and copolymers are suitable for material of the first image receiving layer due to the following reason:

(1) The polymer and copolymer show no tackiness at room temperature. (2) The polymer and copolymer have low Young's modulus (modulus of elasticity). (3)

Young's modulus can be easily controlled because the polymer and copolymer have a number of plasticizers showing good compatibility. (4) Bonding strength to other layer or film can be easily controlled because the polymer and copolymer have a polar group such as hydroxy or carboxy.

The first image receiving layer may further contain other various polymer, surface-active agent, surface lubricant or agent for improving adhesion in order to control bonding strength between the first receiving layer and the support or the second image receiving layer. Further, the first image receiving layer preferably contain tacky polymer (tackifire) in small amount to reduce Young's modulus, so long as the layer has no tackiness.

Examples of the plasticizer include polyester, multifunctional acrylate monomer (acrylate monomer having a number of vinyl groups such as acryloyl or methacryloyl groups), urethane oligomer and copolymers of a monomer having ethylene group, and fatty acid vinyl ester or (meth)acrylic acid alkyl ester.

Examples of the polyester plasticizer include polyesters having adipic acid unit, phthalic acid unit, sebasic acid unit, trimellitic acid unit, pyromellitic acid unit, citric acid unit and epoxy bond. Preferred are polyesters having phthalic acid unit and sebasic acid unit.

Preferred examples of multifunctional acrylate monomers include hexafunctional acrylate and dimethacrylate monomers as described below

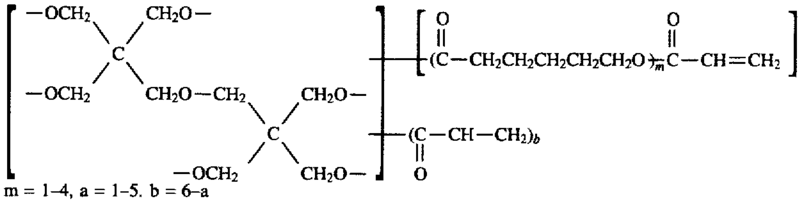

m = 1-4, a = 1-5. b = 6-a

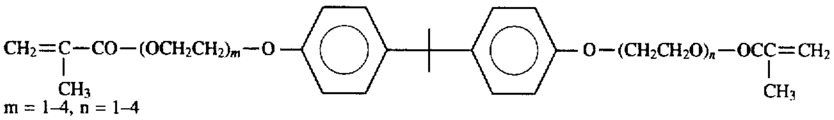

m = 1-4, n = 1-4

$CH_2=CH-CO-O-(CH_2CH_2O)_n-OC-CH=CH_2$ n = 1-4

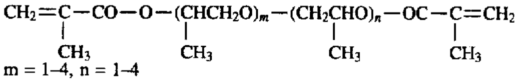

m = 1-4, n = 1-4

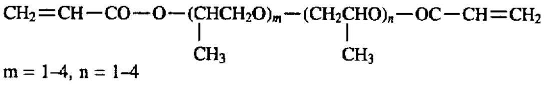

m = 1-4, n = 1-4

For example, when a fluorine-containing surface active agent is incorporated into the first or second image receiving sheet, wetting property between the receiving layer and the heat sensitive ink layer is improved to giving dots of good shape. However, excessive incroporation of the surface active agent brings about dot of undesired shape (irregular shape). Hence, the surface-active agent or surface lubricant is preferably incorporated in the layer in the amount of 0.0001 to 5 weight %, especially 0.001 to 3 weight %.

In the case that polyvinyl chloride or copolymer containing vinyl chloride is employed, an organic tin-type stabilizer such as tetrabutyltin or tetraoctyltin is preferably incorporated into the polymer or copolymer.

Of the polymer materials employed in the first image receiving layer, polymer materials having a large Young's modulus preferably contain a plasticizer to supplement cushion characteristics. The plasticizer preferably has a molecular weight of not less than 1,000, because it dose not tend to bleed out on the layer. The plasticizer moved on a surface of the layer brings about occurrence of sticking or adhesion of dust or dirt. Further, the plasticizer preferably has a molecular weight of not more than 5,000, because it does not show sufficient compatibility with the polymer materials employed in the first image receiving layer or it lowers cushioning characteristics of the first image receiving layer so that a thickness of the first image receiving layer is needed to increase.

Examples of urethane oligomers include polymers prepared from at least one of conventional polyisocyanates and at least one of conventional polyether diols or polyester diols, and polyfunctional urethane acrylates such as aromatic urethane acrylate and aliphatic urethane acrylates. Preferred examples are aromatic urethane acrylate and aliphatic urethane acrylates.

Example of copolymers of a monomer having ethylene group and fatty acid vinyl ester or (meth)acrylic acid alkyl ester include copolymers of ethylene and vinyl ester of fatty acid such as saturated fatty acid (e.g., acetic acid, propionic acid, butyric acid or stearic acid), unsaturated fatty acid, carboxylic acid having cycloalkane, carboxylic acid having aromatic ring or carboxylic acid having heterocyclic ring. Examples of acrylic acid alkyl ester include methyl acrylate, ethyl acrylate, butyl acrylate, 2-ethylhexyl acrylate, methoxyethyl acrylate, methyl methacrylate, ethyl methacrylate, butyl methacrylate, hexyl methacrylate, decyloctyl methacrylate, lauryl methacrylate, stearyl methacrylate, dimethylaminoethyl methacrylate and methacrylamide. The above monomers copolymerized with the monomer having ethylene group can be employed singly or in two kinds or more depending upon desired property of the resultant polymer.

A supplemental binder such as acrylic rubber or linear polyurethane is incorporated into the first image receiving layer, if desired. It is occasionally possible that incorporation of the supplemental binder reduces the amount of the plasticizer whereby the bleeding and sticking or adhesion of dust on the image receiving layer can be prevented.

A thickness of the first image receiving layer preferably is in the range of 1 to 50 μm, especially 5 to 30 μm. The thickness is determined by the following reasons: 1) the thickness should be larger than a depth of unevenness of surface of the white paper sheet, 2) the thickness should be that capable of cushioning a thickness of the overlapped portion of a number of color images, and 3) the thickness should have sufficient cushioning characteristics.

The image of the heat sensitive material which has been transferred on the second image receiving layer of the image receiving sheet having the first and second image receiving layers according to the invention, is further retransferred onto the white paper sheet. In the procedure, the second image receiving layer is transferred on the white paper sheet together with the image. Hence, a surface of the image on the white paper sheet has gloss near to that of a printed image with subjecting to no surface treatment such as matting treatment, due to the second image receiving layer provided on the image. Further, the second image receiving layer improves scratch resistance of the retransferred image, and is furthermore almost free from occurrence of tackiness (adhesion) or sticking.

The second image receiving layer of the invention comprises butyral resin (polyvinyl butyral) and a polymer having at least one unit of recurring units represented by the following formula (I):

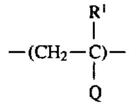

(I)

wherein $R^1$ represents a hydrogen atom or a methyl group; and

Q represents:

—$CONR^2R^3$ in which each of $R^2$ and $R^3$ independently represents a hydrogen atom, an alkyl group of 1 to 18 carbon atoms, an alkyl group of 1 to 18 carbon atoms which is substituted with at least one group or atom selected from the group consisting of hydroxyl, alkoxy of 1 to 6 carbon atoms, acetamide, halogen and cyano, an aryl group of 6 to 20 carbon atoms, an aryl group of 6 to 20 carbon atoms which is substituted with at least one group or atom selected from the group consisting of hydroxyl, alkoxy of 1 to 6 carbon atoms, halogen and cyano, an acyl group of 2 to 6 carbon atoms, a phenylsulfonyl group, a phenylsulfonyl group which is substituted with alkyl of 1 to 6 carbon. atoms; or $R^2$ and $R^3$ is combined together with the nitrogen atom to form a 5–7 membered heterocyclic group (e.g., pyrrolidinyl, piperidino, piperazino (residue of piperazine) or morpholino);

a nitrogen-containing heterocyclic group; or a group having the formula (II):

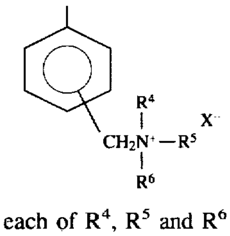

(II)

in which each of $R^4$, $R^5$ and $R^6$ independently represents an alkyl group of 1 to 25 carbon atoms, an alkyl group of 1 to 25 carbon atoms which is substituted with at least one group or atom selected from the group consisting of hydroxyl, alkoxy of 1 to 6 carbon atoms, halogen and cyano, an aralkyl group of 7 to 25 carbon atom, an aralkyl group of 7 to 25 carbon atoms which is substituted with at least one group or atom selected from the group consisting of hydroxyl, alkoxy of 1 to 6 carbon atoms, halogen and cyano, an aryl group of 6 to 25 carbon atoms, or an aryl group of 6 to 25 carbon atoms which is substituted with at least one group or atom selected from the group consisting of hydroxyl, alkoxy of 1 to 6 carbon atoms, halogen and cyano; and $X^-$ represents $Cl^-$, $Br^-$ or $I^-$.

The nitrogen-containing heterocyclic group preferably is an imidazolyl group, an imidazolyl group which is substituted with at least one group or atom selected from the group consisting of alkyl of 1 to 5 carbon atoms, aryl of 6 to 10 carbon atoms, halogen and cyano, a residue of pyrrolidone, a residue of pyrrolidone which is substituted with at least one group or atom selected from the group consisting of alkyl of 1 to 5 carbon atoms, aryl of 6 to 10 carbon atoms, halogen and cyano, a pyridyl group, a pyridyl group which is substituted with at least one group or atom selected from the group consisting of alkyl of 1 to 5 carbon atoms, aryl of 6 to 10 carbon atoms, halogen and cyano, a carbazolyl group, a carbazolyl group which is substituted with at least one group or atom selected from the group consisting of alkyl of 1 to 5 carbon atoms, aryl of 6 to 10 carbon atoms, halogen and cyano, a triazolyl group or a triazolyl group which is substituted with at least one group or atom selected from the group consisting of alkyl of 1 to 5 carbon atoms, aryl of 6 to 10 carbon atoms, halogen and cyano. Examples of the alkyl include methy, ethyl and propyl. Examples of the aryl include phenyl and naphtyl.

Especially, the nitrogen-containing heterocyclic group is an imidazolyl group, an imidazolyl group which is substituted with at least one of alkyl groups of 1 to 5 carbon atoms.

$R^2$ and $R^3$ of —$CONR^2R^3$ preferably is a hydrogen atom, an alkyl group of 1 to 10 carbon atom, an alkyl group of 1 to 10 carbon atom which is substituted with hydroxyl, acetamide, or alkoxy of 1 to 6 carbon atoms, an aryl group of 6 to 15 carbon atoms, or an aryl group of 6 to 15 carbon atoms which is substituted with hydroxy or alkoxy of 1 to 6 carbon atoms, an acyl group of 2 to 6 carbon atoms, a phenylsulfonyl group, a phenylsulfonyl group which is substituted with alkyl of 1 to 6 carbon atoms. Examples of the alkyl group include methyl, ethyl, isopropyl, n-propyl, n-butyl, iso-butyl, tert-butyl, n-pentyl, n-hexyl, n-octyl, nonyl and decyl. Examples of the aryl group include phenyl and naphthyl. Examples of the acyl group include acetyl, propionyl, butyryl and isobutyryl. Examples of the alkoxy include methoxy, ethoxy, propoxy and butoxy.

Otherwise, $R^2$ and $R^3$ is preferably combined together with the nitrogen atom to form a 5–7 membered heterocyclic group (e.g., pyrrolidinyl, piperidino, piperazino (residue of piperazine) or morpholino.

In the group having the formula (II), each of $R^4$, $R^5$ and $R^6$ preferably is an alkyl group of 1 to 20 carbon atom, an alkyl group of 1 to 20 carbon atom which is substituted with at least one group selected from alkoxy of 1 to 6 carbon atom, halogen and cyano, an aralkyl group of 7 to 18 carbon atom, an aralkyl group of 7 to 18 carbon atoms which is substituted with at least one group selected from alkoxy of 1 to 6 carbon atom, halogen and cyano, an aryl group of 6 to 20 carbon atoms, or an aryl group of 6 to 20 carbon atoms which is substituted with at least one group selected from alkoxy of 1 to 6 carbon atom, halogen and cyano; and $X^-$ represents $Cl^-$, $Br^-$ or $I^-$. Examples of the alkyl group include methyl, ethyl, isopropyl, n-propyl, n-butyl, isobutyl, tert-butyl, n-pentyl, n-hexyl, n-octyl, nonyl and decyl. Examples of the aryl group include phenyl and naphthyl. Examples of the aralkyl group include benzyl and phenethyl.

Examples of the alkoxy include methoxy, ethoxy, propoxy and butoxy.

Examples of monomers employed for forming a recurring unit represented by the formula (I) wherein Q represents a group of —$CONR^2R^3$ or a nitrogen-containing heterocyclic group, include (meth) acrylamide, N-alkyl (meth) acrylamide (examples of alkyl: methyl, ethyl, propyl, n-butyl, tertbutyl, heptyl, octyl, ethylhexyl, cyclohexyl, hydroxyethyl and benzyl), N-aryl (meth) acrylamide (examples of aryl: phenyl, tolyl, nitrophenyl, naphthyl and hydroxyphenyl), N,N-dialkyl(meth)acrylamide (examples of alkyl: methyl, ethyl, n-butyl, iso-butyl, ethylhexyl and cyclohexyl), N,N-diaryl (meth) acrylamide (example of aryl: phenyl), N-methyl-N-phenyl (meth) acrylamide, N-hydroxyethyl-N-methyl(meth)acrylamide, N-2-acetoamide-ethyl-N-acetyl(meth)acrylamide, N-(phenylsulfonyl-)(meth)acrylamide, N-(p-methylphenylsulfonyl)(meth)acrylamide, 2-hydroxyphenylacrylamide, 3-hydroxyphenylacrylamide, 4-hydroxyphenylacrylamide, (meth)acryloylmorpholin, 1-vinylimidazole, 1-vinyl-2-methylimidazole, 1-vinyltriazole, 1-vinyl-3,5-dimethylimidazole, vinylpyrrolidone, 4-vinylpyridine and vinylcarbazole.

Examples of monomers employed for forming a recurring unit represented by the formula (I) wherein Q represents a group having the formula (II) include N,N,N-(trialkyl)-N-(styrylmethyl)-ammonium chloride, N,N,N-(trialkyl)-N-(styrylmethyl)-ammonium bromide, N,N,N-(trialkyl)-N-(styrylmethyl)-ammonium iodide (examples of alkyl: methyl, ethyl, propyl, n-butyl, tert-butyl, heptyl, hexyl, octyl, iso-octyl, dodecyl, ethylhexyl and cyclohexyl), N,N-(dimethyl)-N-(dodecyl)-N-(styrylmethyl)-ammonium chloride, N,N-(dimethyl)-N-(benzyl)-N-(styrylmethyl)-ammonium chloride, N,N,N-(trimethoxyethyl)-N-(styrylmethyl)-ammonium chloride and N,N-(dimethyl)-N-(phenyl)-N-(styrylmethyl)-ammonium chloride.

Examples of monomers copolymerizable with the monomers employed for forming a recurring unit represented by the formula (I) include (meth) acrylic acid esters (i.e., acrylic acid esters and methacrylic acid esters) such as alkyl (meth) acrylates and substituted-alkyl (meth)acrylates (e.g., methyl (meth)acrylate, ethyl (meth)acrylate, n-propyl (meth)acrylate, iso-propyl (meth)acrylate, butyl (meth) acrylate, amyl (meth)acrylate, hexyl (meth)acrylate, cyclohexyl (meth-)acrylate, ethylhexyl (meth)acrylate, octyl (meth)acrylate, tert-octyl (meth)acrylate, chloroethyl (meth)acrylate, allyl (meth)acrylate, 2-hydroxy (meth)acrylate, 2-hydroxypropyl (meth)acrylate, 4-hydroxybutyl (meth)acrylate, 2,2-dimethyl-3-hydroxypropyl (meth) acrylate, 5-hydroxypentyl (meth)acrylate, trimethylolpropane mono(meth)acrylate, pentaerithritol mono(meth)acrylate, benzyl (meth)acrylate, methoxybenzyl (meth)acrylate, chlorobenzyl (meth)acrylate, furfuryl (meth)acrylate, tetrahydrofurfuryl (meth)acrylate and phenoxyethyl(meth)acrylate), and aryl (meth)acrylates (e.g., phenyl(meth)acrylate, cresyl (meth)acrylate and naphthyl (meth)acrylate); styrenes such as styrene and alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrenes (e.g., methoxystyrene, 4-methoxy-3-methylstyrene and dimethoxystyrene), halogenostyrenes (e.g., chlorostyrene, dichlorostyrene, trichlorostyrene, pentachlorostyrene, bromostyrene, dibromostyrene, iodostyrene, fluorostyrene, trifluorostyrene, 2-bromo-4-trifluorostyrene and 4-fluoro-3-trifluoromethylstyrene) and hydroxystyrene; crotonic acid esters such as alkyl crotonates (e.g., butyl crotonate, hexyl crotonate and glycerol monocrotonate); acids having a vinyl group such as (meth)acrylic acid, crotonic acid and itaconic acid; and acrylonitrile.

Examples of polymers having at least one unit selected from recurring units represented by the formula (I), include N,N-dimethylacrylamide/butyl (meth)acrylate copolymer, N,N-dimethyl(meth)acrylamide/2-ethylhexyl (meth)acrylate copolymer, N,N-dimethyl(meth)acrylamide/hexyl (meth)acrylate copolymer, N-butyl(meth)acrylamide/butyl (meth)acrylate copolymer, N-butyl(meth)acrylamide/2-ethylhexyl (meth)acrylate copolymer, N-butyl-(meth)acrylamide/hexyl (meth)acrylate copolymer, (meth)acryloylmorpholin/butyl (meth)acrylate copolymer, (meth)acryloylmorpholin/2-ethylhexyl (meth)acrylate copolymer, (meth)acryloylmorpholin/hexyl (meth)acrylate copolymer, 1-vinylimidazole/butyl (meth)acrylate copolymer, 1-vinylimidazole/2-ethylhexyl (meth)acrylayte copolymer, 1-vinylimidazole/hexyl (meth)acrylayte copolymer; N,N-dimethylacrylamide/butyl (meth)acrylate/N,N,N-(trihexyl)-N-(styrylmethyl)-ammonium chloride copolymer, N,N-dimethylacrylamide/butyl (meth)acrylate/N,N,N-(trioctyl)-N-(styrylmethyl)-ammonium chloride copolymer, N,N-dimethylacrylamide/butyl (meth)acrylate/N,N,N-(tridecyl)-N-(styrylmethyl)-ammonium chloride copolymer, N,N-dimethylacrylamide/butyl (meth)acrylate/N,N,N-(trihexyl)-N-(styrylmethyl)-ammonium iodide copolymer, N,N-dimethyl(meth)acrylamide/hexyl (meth)acrylate/N,N,N-(trihexyl)-N-(styrylmethyl)-ammonium chloride copolymer, (meth)acryloylmorpholin/2-ethylhexyl (meth)acrylate/N,N-(dimethyl)-N-(benzyl)-N-(styrylmethyl)-ammonium chloride copolymer, N-butyl(meth)acrylamide/hexyl (meth-)acrylate/N,N,N-(trimethoxyethyl)-N-(styrylmethyl)-ammonium chloride copolymer, and N,N,N-(trihexyl)-N-(styrylmethyl)-ammonium chloride polymer.

The polymer having recurring unit of the formula (I) preferably contain the recurring unit in the amount of 10 to 100 molar %, especially in the amount of 30 to 80 molar %. When the amount of the recurring unit is not less than 10 molar %, the transferred image shows low quality. Weight-average molecular weight of the polymer preferably is in the range of 1,000 to 200,000, especially 2,000 to 100,000. The molecular weight of less than 2,000 renders its preparation difficult, and the molecular weight of more than 200,000 reduces solubility of the polymer in a solvent.

The second image receiving layer may contain other various polymers other than butyral resin and the polymer having recurring unit of the formula (I). Examples of these polymers include polyolefins such as polyethylene and polypropylene; copolymers of ethylene and other monomer such as vinyl acetate or acrylic acid ester; polyvinyl chloride; copolymers of vinyl chloride and other monomer such vinyl acetate; copolymer containing vinylidene chloride; polystyrene; copolymer of styrene and other monomer such as maleic acid ester; polyvinyl acetate; butyral resin; modified polyvinyl alcohol; polyamides such as copolymerized nylon and N-alkoxymethylated nylon; synthetic rubber; chlorinated rubber; phenol resin; epoxy resin; urethane resin; urea resin; melamine resin; alkyd resin; maleic acid resin; copolymer containing hydroxystyrene; sulfonamide resin; rosin ester; cellulose derivatives; and rosin.

The polymer having recurring unit of the formula (I) is generally contained in the amount of 5 to 50 weight % based on the total amount of the polymers of the second image receiving layer, and preferably 10 to 30 weight %.

The second image receiving layer can contain surface-active agent, surface lubricant, plasticizer or agent for improving adhesion in order to control bonding strength between the second image receiving layer and the first image receiving layer or the heat sensitive ink layer. Further, it is preferred to employ a solvent not to dissolve or swell the resin contained in the first image receiving layer as a solvent used in a coating liquid for forming the second image receiving layer. For example, when polyvinyl chloride, which easily dissolves in various solvents, is used as a resin of the first image receiving layer, a solvent used in the coating liquid of the second image receiving layer preferably is alcohols or solvents mainly containing water.

A thickness of the second receiving layer preferably is in the range of 0.1 to 10 μm, especially 0.5 to 5.0 μm. The thickness exceeding 10 μm damages unevenness (gloss) of the transferred image derived from an uneven surface of the white paper sheet (onto which the image on the image receiving sheet is retransferred) and therefore the transferred image is not near to a printed image due to its high gloss.

In order to control the bonding strength between the first and second image receiving layers, materials contained in the first and second image receiving layers are generally different from each other mentioned above; for example, the materials are used in combination of hydrophilic polymer and liophilic polymer, in combination of polar polymer and nonpolar polymer, or as the materials additives such as surface-active agent, surface lubricant such as fluorine compound or silicone compound, plasticizer or agent for improving adhesion such as silan coupling agent are appropriately used.

On the second image receiving layer, a lubricating layer (overcoating layer) can be provided to improve lubricating property and scratch resistance of a surface of the second image receiving layer.

Examples of materials forming the layer include a fatty acid (e.g., palmitic acid or stearic acid), a metal salt of a fatty acid (e.g., zinc stearate), a fatty acid derivative (e.g., fatty acid ester, its partial saponification product or fatty acid amide), a higher alcohol, a polyol derivative (e.g., ester of polyol), wax (e.g., paraffin wax, carnauba wax, montan wax, bees wax, Japan wax, or candelilla wax), polydimethylsiloxane and polydiphenylsiloxane), cationic surfactant (e.g., ammonium salt having long aliphatic chain group or pyridinium salt), anionic and nonionic surfactants having a long aliphatic chain group, and perfluoro-type surfactant.

An intermediate layer can be provided between the first and second image receiving layers. in order to control transferring property.

The heat sensitive ink sheet employed with the image receiving sheet of the invention generally has a support sheet and a heat sensitive ink layer having a thickness of 0.2 to 1.0 μm which is formed of a heat sensitive ink material comprising 30 to 70 weight % of colored pigment, 25 to 60 weight % of amorphous organic polymer having a softening point of 40° to 150° C. (preferably and 0.1 to 20 weight part of nitrogen-containing compound). The heat sensitive ink sheet can be particularly utilized in formation of multigradation image (especially multicolor image) by area gradation (multi-valued recording), while the sheet can be naturally utilized in binary recording.

Why incorporation of the nitrogen-containing compound into the heat sensitive ink sheet brings about formation of good transferred image is presumed as follows: A sizing agent such as clay is contained in a paper for print (e.g., coated paper), and the compound has affinity for the sizing agent, whereby the transferring property can be improved and influence of environment on the transferring procedure can be reduced.

As the support sheet, any of the materials of the support sheets employed in the conventional fused ink transfer system and sublimation ink transfer system can be employed. Preferably employed is a polyester film of approx. 5 μm thick which has been subjected to release treatment.

The colored pigment to be incorporated into the heat sensitive ink layer can be optionally selected from known pigments. Examples of the known pigments include carbon black, azo-type pigment, phthalocyanine-type pigment, qunacridone-type pigment, thioindigo-type pigment, anthraquinone-type pigment, and isoindolin-type pigment. These pigments can be employed in combination each other. A known dye can be employed in combination with the pigment for controlling hue of the color image.

The heat transfer ink layer contains the pigment in the amount of 30 to 70 weight % and preferably in the amount of 30 to 50 weight %. When the amount of the pigment is not less than 30 weight %, it is difficult to form an ink layer of high reflection density in the thickness of 0.2 to 1.0 μm.

Moreover, the pigment preferably has such particle distribution that at least 70 weight % of the pigment particle has a particle size of not less than 1.0 μm. A pigment particle of large particle size reduces transparency of the formed image, particularly in the area in which a number of color images are overlapped. Further, large particles bring about difficulty to prepare the desired ink layer satisfying the relationship between the preferred thickness and reflection density.

Any of amorphous organic polymers having a softening point of 40° to 150° C. can be employed for the preparation of the ink layer of the heat sensitive ink sheet of the invention. A heat-sensitive ink layer using an amorphous organic polymer having a softening point of lower than 40° C. shows unfavorable adhesion, and a heat-sensitive ink layer using an amorphous organic polymer having a softening point of higher than 150° C. shows poor sensitivity. Examples of the amorphous organic polymers include butyral resin, polyamide resin, polyethyleneimine resin, sulfonamide resin, polyester-polyol resin, petroleum resin, homopolymers and copolymers of styrene or its derivatives (e.g., styrene, vinyltoluene, α-methylstyrene, 2-methylstyrene, chlorostyrene, vinylbenzoic acid, sodium vinylbenzenesulfonate and aminostyrene), and homopolymers and copolymers of methacrylic acid or its ester (e.g., methacrylic acid, methyl methacrylate, ethyl methacrylate, butyl methacrylate, and hydroxyethyl methacrylate), homopolymers and copolymers of acrylic acid or its ester (e.g., acrylic acid, methyl acrylate, ethyl acrylate, butyl acrylate, and α-ethylhydroxy acrylate), homopolymers and copolymers of a diene compound (e.g., butadiene and isoprene), and homopolymers and copolymers of other vinyl monomers (e.g., acrylonitrile, vinyl ether, maleic acid, maleic acid ester, maleic anhydride, cinnamic acid, vinyl chloride, and vinyl acetate). Further, there can be mentioned copolymers of at least two monomers selected from methacrylic acid or its ester, methacrylic acid or its ester, a diene compound and other vinyl monomers, which are described above. These resins and polymers can be employed combination.

Particularly preferred are butyral resin and styrenemaleic acid half ester resin, from the viewpoint of good dispersibility of the pigment.

Examples of trade names of the butyral resin include Denka butyral #2000-L (softening point: 57° C. (measured by DSC (Differential Scanning Calorimeter)); degree of polymerization: approx. 300) and Denka butyral #4000-1 (softening point: 57° C.; degree of polymerization: approx. 920) which are available from Denki Kagaku Kogyo K.K.; and Eslec BX-10 (softening point: 72° C.; Tg: 74° C., degree of polymerization: 80, acetyl value: 69 molar %) and Eslec BL-S (Tg: 61° C., viscosity: 12 cps) which are available from Sekisui Chemical Co., Ltd.

In the heat sensitive ink sheet, the ink layer contains the amorphous organic polymer having a softening point of 40° to 150° C. in the amount of 25 to 65 weight %, and preferably in the amount of 30 to 50 weight %.

The nitrogen-containing compound contained in the heat sensitive ink layer is preferably an amide compound having the formula (III):

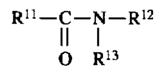

in which $R^{11}$ represents an alkyl group of 8 to 24 carbon atoms, an alkoxyalkyl of 8 to 24 carbon atoms, an alkyl group of 8 to 24 carbon atoms having a hydroxyl group, or an alkoxyalkyl of 8 to 24 carbon atoms having a hydroxyl group, each of $R^{12}$ and $R^{13}$ independently represents a hydrogen atom, an alkyl group of 1 to 12 carbon atoms, an alkoxyalkyl of 1 to 12 carbon atoms, an alkyl group of 1 to 12 carbon atoms having a hydroxyl group, or an alkoxyalkyl of 1 to 12 carbon atoms having a hydroxyl group, provided that $R^{11}$ is not the alkyl group in the case that $R^{12}$ and $R^{13}$ both represent a hydrogen atom. an amine compound, a quaternary ammonium salt having the formula (IV):

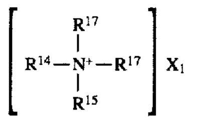

in which $R^{14}$ represents an alkyl group of 1 to 18 carbon atom or an aryl group of 6 to 18 carbon atoms, each of $R^{15}$, $R^{16}$ and $R^{17}$ independently represents a hydrogen atom, a hydroxy group, an alkyl group of 1 to 18 carbon atom or an aryl group of 6 to 18 carbon atoms, and $X_1$ represents a monovalent anion, or formula (V):

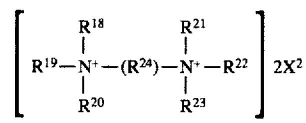

in which each of $R^{18}$, $R^{19}$, $R^{20}$, $R^{21}$, $R^{12}$ and $R^{23}$ independently represents a hydrogen atom, a hydroxy group, an alkyl group of 1 to 18 carbon atom or an aryl group of 6 to 18 carbon atoms, $R^{24}$ represents an alkylene group of 1 to 12 carbon atom, and $X_2$ represents a monovalent anion, hydarazine, aromatic amine or heterocyclic compound. Preferred is the amide compound having the formula (III) or the quaternary ammonium salt having the formula (IV) or formula (V).

The amide compound having the formula (III) is explained. In the formula (III), $R^{11}$ generally is an alkyl group of 8 to 18 carbon atoms, an alkoxyalkyl of 8 to 18 carbon atoms, an alkyl group of 8 to 18 carbon atoms having a hydroxyl group, or an alkoxyalkyl of 8 to 18 carbon atoms having a hydroxyl group. $R^{11}$ preferably is an alkyl group of 8 to 18 carbon atoms (especially 12 to 18 carbon atoms) or an alkyl group of 8 to 18 carbon atoms (especially 12 to 18 carbon atoms) having a hydroxyl group. $R^{12}$ generally represents a hydrogen atom, an alkyl group of 1 to 10 carbon atoms (especially 1 to 8 carbon atoms), an alkoxyalkyl of 1 to 10 carbon atoms (especially 1 to 8 carbon atoms), an alkyl group of 1 to 10 carbon atoms having a hydroxyl group (especially 1 to 8 carbon atoms), or an alkoxyalkyl of 1 to 10 carbon atoms having a hydroxyl group (especially 1 to 8 carbon atoms). $R^{12}$ preferably is an alkyl group of 1 to 10 carbon atom (especially 1 to 8 carbon atoms) or an alkyl group of 1 to 10 carbon atom (especially 1 to 8 carbon atoms) having a hydroxyl group. Examples of the alkyl group include methyl, ethyl, isopropyl, n-propyl, n-butyl, iso-butyl, tert-butyl, n-pentyl, n-hexyl, n-octyl, nonyl, decyl, undecyl, dodecyl, tridecyl, tetradecyl, pentadecyl, hexadecyl, heptadecyl and octadecy.

$R^{13}$ preferably is a hydrogen atom, an alkyl group of 1 to 4 carbon atom (especially 1 to 3 carbon atoms). Especially, $R^{13}$ preferably is a hydrogen atom. Examples of the alkyl group include methyl, ethyl, isopropyl, n-propyl, n-butyl, iso-butyl and tert-butyl.

However, $R^{11}$ is not the above alkyl group in the case that $R^{12}$ and $R^{13}$ both represent a hydrogen atom.

The amide of the formula (III) can be prepared by reacting acyl halide with amine (by adding acyl halide into an alkaline aqueous solution containing the amine) to introduce the acyl group into the amine, which is performed, for example, according to Schotten-Baumann method. In more detail, acyl halide is dropwise added into an chilled alkaline solution containing amine, and operations such as addition and mixing are conducted so as to maintain the reaction temperature of not more than 15° C. In the reaction, use of amine, alkali and acyl halide in a ratio of 1:1:1 gives an amide compound.

In the case that amine hardly dissolving in water is used, an ether solution containing tertiary amine is employed instead of an alkaline aqueous solution. In more detail, acyl halide is dropwise added into an ether solution containing amine and triethylamine. In the reaction, use of amine, triethylamine and acyl halide in a ratio of 1:1:1 gives an amide compound. The obtained amide compound can be further purified by recrystallization if desired, to give a pure amide compound.

The amide compound of the formula (III) can be, for example, prepared by using acyl halide and amine in the combinations in Table 1.

TABLE 1

| Acyl Halide | Amine |
|---|---|
| $CH_3(CH_2)_5CH(OH)(CH_2)_{10}COCl$ | $H_2NC_2H_4OH$ |
| $CH_3(CH_2)_5CH(OH)(CH_2)_{10}COCl$ | $NH_3$ |
| $n\text{-}C_9H_{19}COCl$ | $CH_3NH_2$ |
| $n\text{-}C_{15}H_{31}COCl$ | $CH_3NH_2$ |
| $n\text{-}C_{17}H_{35}COCl$ | $CH_3NH_2$ |
| $n\text{-}C_{17}H_{35}COCl$ | $C_2H_5NH_2$ |
| $n\text{-}C_{17}H_{35}COCl$ | $n\text{-}C_4H_9NH_2$ |
| $n\text{-}C_{17}H_{35}COCl$ | $n\text{-}C_6H_{13}NH_2$ |
| $n\text{-}C_{17}H_{35}COCl$ | $n\text{-}C_8H_{17}NH_2$ |
| $n\text{-}C_{17}H_{35}COCl$ | $H_2NC_2H_4OC_2H_4OH$ |
| $n\text{-}C_{17}H_{35}COCl$ | $(CH_3)_2NH$ |
| $n\text{-}C_{17}H_{35}COCl$ | $(C_2H_5)_2NH$ |

Examples of the obtained amide compounds are shown in Table 2. The compounds are indicated by $R^{11}$, $R^{12}$ and $R^{13}$ of the formula (III).

TABLE 2

| $R^1$ | $R^2$ | $R^3$ |
|---|---|---|
| $CH_3(CH_2)_5CH(OH)(CH_2)_{10}$ | $C_2H_4OH$ | H |
| $CH_3(CH_2)_5CH(OH)(CH_2)_{10}$ | H | H |
| n-$C_9H_{19}$ | $CH_3$ | H |
| n-$C_{15}H_{31}$ | $CH_3$ | H |
| n-$C_{17}H_{35}$ | $CH_3$ | H |
| n-$C_{17}H_{35}$ | $C_2H_5$ | H |
| n-$C_{17}H_{35}$ | n-$C_4H_9$ | H |
| n-$C_{17}H_{35}$ | n-$C_6H_{13}$ | H |
| n-$C_{17}H_{35}$ | n-$C_8H_{17}$ | H |
| n-$C_{17}H_{35}$ | $C_2H_4OC_2H_4OH$ | H |
| n-$C_{17}H_{35}$ | $CH_3$ | $CH_3$ |
| n-$C_{17}H_{35}$ | $C_2H_5$ | $C_2H_5$ |

Subsequently, the quaternary ammonium salt of the formula (IV) described above is explained below.

In the formula (IV), $R^{14}$ preferably is an alkyl group of 1 to 12 carbon atom (especially 1 to 8 carbon atom) or an aryl group of 6 to 12 carbon atoms (e.g., phenyl or naphthyl). Examples of the alkyl group include methyl, ethyl, isopropyl, n-propyl, n-butyl, iso-butyl, tert-butyl, n-pentyl, n-hexyl and n-octyl. Each of $R^{15}$, $R^{16}$ and $R^{17}$ preferably is an alkyl group of 1 to 12 carbon atom (especially 1 to 8 carbon atom) or an aryl group of 6 to 12 carbon atoms (e.g., phenyl or naphthyl). Examples of the alkyl group include methyl, ethyl, isopropyl, n-propyl, n-butyl, iso-butyl, tert-butyl, n-pentyl, n-hexyl and n-octyl. $X_1$ preferably is halide ion, especially $Cl^-$ or $Br^-$.

Examples of the quaternary ammonium salt of the formula (IV) include ammonium chloride, tetra-n-butylammoniumbromide and triethylmethylammonium chloride.

The quaternary ammonium salt of the formula (V) is dimmer of the quaternary ammonium salt, and the example includes hexamethonium bromide [i.e., hexamethylene-bis(trimethylammoniumbromide)].

Examples of the amine mentioned above include cyclohexylamine, trioctylamine and ethylenediamine.

Examples of the hydrazine mentioned above include dimethylhydradine.

Examples of the aromatic amine mentioned above include p-toluidine, N,N-dimethylaniline and N-ethylaniline.

Examples of the heterocyclic compound mentioned above include N-methylpyrrole, N-ethylpyridinium bromide, imidazole, N-methylquinolinium bromide and 2-methylbenzothiazole.

The heat sensitive ink layer generally contains 1 to 20 weight % of the nitrogen-containing compound, and especially 1 to 10 weight % of the compound. The compound preferably exists in the heat sensitive ink sheet in the amount of 0.01 to 2 g per 1 $m^2$.

The heat sensitive ink layer preferably has tensile strength at break of not more than 10 MPa (not less than 0.1 MPa). The heat sensitive ink layer having tensile strength at break more than 10 MPa does not gives dots having even size and small size, and an image of satisfactory gradation on the shadow portion. Further, the heat sensitive ink layer preferably has a peeling force of not less than 3 dyn/mm at a peeling rate of the ink sheet in the direction parallel to a surface of the image receiving sheet from the image receiving sheet of 500 mm/min., after the ink sheet is pressed on the image receiving layer at such minimum energy that all the ink layer can be transferred onto the image receiving sheet.

The ink layer can further contain 1 to 20 weight % of additives such as a releasing agent and/or a softening agent based on the total amount of the ink layer so as to facilitate release of the ink layer from the support when the thermal printing (image forming) takes place and increase heat-sensitivity of the ink layer. Examples of the additives include a fatty acid (e.g., palmitic acid and stearic acid), a metal salt of a fatty acid (e.g., zinc stearate), a fatty acid derivative (e.g., fatty acid ester and its partial saponification product), a higher alcohol, a polyol derivative (e.g., ester of polyol), wax (e.g., paraffin wax, carnauba wax, montan wax, bees wax, Japan wax, and candelilla wax), low molecular weight polyolefin (e.g., polyethylene, polypropylene, and polybutyrene) having a viscosity mean molecular weight of approx. 1,000 to 10,000, low molecular weight copolymer of olefin (specifically α-olefin) with organic acid (e.g., maleic anhydride, acrylic acid, and methacrylic acid) or vinyl acetate, low molecular weight oxidized polyolefin, halogenated polyolefin, homopolymer of acrylate or methacrylate (e.g., methacylate having a long alkyl chain such as lauryl methacrylate and stearyl methacrylate, and acrylate having a perfluoro group), copolymer of acrylate or methacrylate with vinyl monomer (e.g., styrene), low molecular weight silicone resin and silicone modified organic material (e.g., polydimethylsiloxane and polydiphenylsiloxane), cationic surfactant (e.g., pyridinium salt), anionic and nonionic surfactants having a long aliphatic chain group, and perfluoro-type surfactant.

The compounds are employed singly or in combination of two or more kinds.

The pigment can be appropriately dispersed in the amorphous organic polymer by conventional methods in the art of paint material such as that using a suitable solvent and a ball mill. The nitrogen-containing compound and the additives are added into the obtained dispersion to prepare a coating liquid. The coating liquid can be coated on the support according to a conventional coating method in the art of paint material to form the heat-sensitive ink layer.

The thickness of the ink layer should be in the range of 0.2 to 1.0 μm, and preferably in the range of 0.3 to 0.6 μm (more preferably in the range of 0.3 to 0.5 μm). An excessively thick ink layer having a thickness of more than 1.0 μm gives an image of poor gradation on the shadow portion and highlight portion in the reproduction of image by area gradation. A very thin ink layer having a thickness o less than 0.2 μm cannot form an image of acceptable optical reflection density.

The heat-sensitive ink layer of the invention mainly comprises a pigment and an amorphous organic polymer, and the amount of the pigment in the layer is high, as compared with the amount of the pigment in the conventional ink layer using a wax binder. Therefore, the ink layer of the invention shows a viscosity of higher than $10^4$ cps at 150° C. (the highest thermal transfer temperature), while the conventional ink layer shows a viscosity of $10^2$ to $10^3$ cps at the same temperature. Accordingly, when the ink layer of the invention is heated, the ink layer per se is easily peeled from the support and transferred onto an image receiving layer keeping the predetermined reflection density. Such peeling type transfer of the extremely thin ink layer enables to give an image having a high resolution, a wide gradation from a shadow potion to a highlight portion, and satisfactory edge sharpness. Further, the complete transfer (100%) of image onto the image receiving sheet gives desired uniform reflection density even in a small area such as characters of 4 point and a large area such as a solid portion.

Subsequently, the image forming method of the invention is described below.

The image forming method (thermal transfer recording) of the invention can be, for example, performed by means of a thermal head (generally using as thermal head printer) or a laser beam using the heat sensitive ink sheet and the image receiving sheet of the invention.

The method utilizing the thermal head can be conducted by the steps of: superposing the heat sensitive ink sheet having the heat sensitive ink layer on the image receiving sheet of the invention; placing imagewise a thermal head the support of the heat sensitive ink sheet to form and transfer an image of the heat sensitive ink material of the ink layer onto the image receiving sheet (the second image receiving layer) by separating the support from the image receiving sheet. The formation of the image using the thermal head is generally carried out utilizing area gradation. The transferred image onto the image receiving layer has an optical reflection density of at least 1.0.

Subsequently, the following procedure can be performed. After a white paper sheet is prepared, the image receiving sheet having the transferred image is superposed on a white sheet, which generally is a support for printing, such a manner that the transferred image is contact with a surface of the white sheet, and the composite is subjected to pressing and heating treatments, and the image receiving sheet (having the first image receiving layer) is removed from the composite whereby the retransferred image can be formed on the white paper sheet (together with the second image receiving layer). The transferred image onto the white sheet has an optical reflection density of at least 1.0.

The above formation of the image can be generally conducted using the thermal head printer by means of area gradation.

Further, the method utilizing the a laser beam can be conducted using a laser beam instead of the above thermal head. The thermal transfer recording method utilizing the a laser beam can utilize methods (i.e., ablation method) described in U.S. Pat. No. 5,352,562 and Japanese Patent Provisional Publication No. 6(1994)-219052. The method of Japanese Patent Provisional Publication No. 6(1994)-219052 is performed by the steps of: superposing a heat sensitive ink sheet comprising a support and a heat sensitive ink layer (image forming layer) between which a light-heat conversion layer capable of converting an absorbed laser beam into heat energy and a heat sensitive peeling layer containing heat sensitive material capable of producing a gas by absorbing the heat energy (or only a light-heat conversion layer further containing the heat sensitive material) are provided on the image receiving sheet in such a manner that the heat sensitive ink layer is contact with a surface of the image receiving sheet; irradiating imagewise a laser beam the composite (the heat sensitive ink sheet and the image receiving sheet) to enhance temperature of the light-heat conversion layer; causing ablation by decomposition or melting of materials of the light-heat conversion layer and decomposing a portion of the heat sensitive peeling layer to produce a gas, whereby bonding strength between the heat sensitive ink layer and the light-heat conversion layer reduces; and transferring the heat sensitive ink layer corresponding to the portion onto the image receiving layer.

The above formation of the image utilizing the ablation can be generally carried out by means of area gradation. The image on the image receiving sheet has also an optical reflection density of at least 1.0. Further, the transferred image can be retransferred onto the white paper sheet, and the retransferred image on the white paper sheet has an optical reflection density of at least 1.0.

Otherwise, in the above method utilizing the ablation, formation of the image can be also conducted by the steps of portionwise melting the heat sensitive ink layer by means of heat energy given by absorption of a laser beam, and transferring the portion onto the image receiving sheet under melting.

The light-heat conversion layer and heat sensitive peeling layer mentioned above are explained below.

The light-heat conversion layer basically comprises a coloring material (e.g., dye or pigment) and a binder.

Examples of the coloring material include black pigments such as carbon black, pigments of large cyclic compounds such as phthalocyanine and naphthalocyanine absorbing a light having wavelength from visual region to infrared region, organic dyes such as cyanine dyes (e.g., indolenine compound), anthraquinone dyes, azulene dyes and phthalocyanine dyes, and dyes of organic metal compounds such as dithiol nickel complex. The light-heat conversion layer preferably is as thin as possible to enhance recording sensitivity, and therefore dyes such as phthalocyanine and naphthalocyanine having a large absorption coefficient are preferably employed.

Examples of the binder include homopolymer or copolymer of acyrylic monomers such as acrylic acid, methacrylic acid, acrylic acid ester and methacrylic acid ester; cellulose derivatives such as methyl cellulose, ethyl cellulose and cellulose acetate; vinyl polymers such as polystyrene, vinyl chloride/vinyl acetate copolymer, polyvinyl pyrrolidone, polyvinyl butyral and polyvinyl alcohol; polycondensation polymers such as polyester and polyamide; and thermoplastic polymers containing rubber butadiene/styrene copolymer. Otherwise, the binder may be a resin formed by polymerization or cross-linkage of monomers such as epoxy compounds by means of light or heating.

A ratio between the amount of the coloring material and that of the binder preferably is in the range of 1:5 to 10:1 (coloring material:binder), especially in the range of 1:3 to 3:1. When the amount of the binder is more than the upper limit, cohesive force of the light-heat conversion layer lowers and therefore the layer is apt to transfer onto the image receiving sheet together with the heat sensitive ink layer in the transferring procedure. Further, the light-heat conversion layer containing excess binder needs a large thickness to show a desired light absorption, which occasionally results in reduction of sensitivity.

The thickness of the light-heat conversion layer generally is in the range of 0.05 to 2 μm, and preferably 0.1 to 1 μm. The light-heat conversion layer preferably shows light absorption of not less than 70% in a wavelength of a used laser beam.

The heat sensitive peeling layer is a layer containing a heat sensitive material. Examples of the material include a compound (e.g., polymer or low-molecular weight compound) which is itself decomposed or changed by means of heating to produce a gas; and a compound (e.g., polymer or low-molecular weight compound) in which a relatively volatile liquid such as water has been adsorbed or absorbed in marked amount. These compounds can be employed singly or in combination of two kinds.

Examples of the polymers which are itself decomposed or changed by means of heating to produce a gas include self-oxidizing polymers such as nitrocellulose; polymers containing halogen atom such as chlorinated polyolefin, chlorinated rubber, polyvinyl chloride and polyvinylidene chloride; acrylic polymers such as polyisobutyl methacylate in which relatively volatile liquid such as water has been adsorbed; cellulose esters such as ethyl cellulose in which relatively volatile liquid such as water has been adsorbed; and natural polymers such as gelatin in which relatively volatile liquid such as water has been adsorbed.

Examples of the low-molecular weight compounds which are itself decomposed or changed by means of heating to produce a gas include diazo compounds and azide compounds.

These compounds which are itself decomposed or changed preferably produce a gas at a temperature not higher than 280° C., especially produce a gas at a temperature not higher than 230° C. (preferably a temperature not lower than 100° C.).

In the case that the low-molecular weight compound is employed as the heat sensitive material of the heat sensitive peeling layer, the compound is preferably employed together with the binder. The binder may be the polymer which is itself decomposed or changed to produce a gas or a conventional polymer having no property mentioned above. A ratio between the low-molecular weight compound and the binder preferably-is in the range of 0.02:1 to 3:1 by weight, especially 0.05:1 to 2:1.

The heat sensitive peeling layer is preferably formed on the whole surface of the light-heat conversion layer. The thickness preferably is in the range of 0.03 to 1 μm, especially 0.05 to 0.5 μm.

The present invention is further described by the following Examples and Comparison Examples. "Part" means "weight part" in the Example.

EXAMPLE 1

Synthesis of Polymer compound (1)

To 170 parts of propylene glycol monomethyl ether was added 0.07 part of 2,2'-azobis(2,4-dimethylvaleronitrile) with stirring at 80° C. in a nitrogen atmosphere to form a mixture. 31.6 parts of butyl acrylate, 24.4 parts of N,N-dimethylacrylamide and 0.07 parts of 2,2'-azobis(2,4-dimethylvaleronitrile) was dropwise added over 30 minutes to the mixture. After 30 minutes and 1 hour, 0.15 part of 2,2'-azobis(2,4-dimethylvaleronitrile) was added to the mixture, and then the mixture was stirred for 4 hours to prepare a 28% propylene glycol monomethyl ether solution of polymer compound (1). The weight average molecular weight was 13,000 (in terms of polystyrene).

Polymer compound (1) (N,N-dimethylacrylamide/butyl acrylate copolymer):

$$-(CH_2-\underset{\displaystyle CO_2C_4H_9(n)}{\underset{|}{CH}})_{50}- \quad -(CH_2-\underset{\displaystyle CON(Me)_2}{\underset{|}{CH}})_{50}-$$

The above unit ratio is molar ratio.

(1) Preparation of image receiving sheet

The following coating liquids for first and second image receiving layers were prepared:

(Coating liquid for first image receiving layer)
- Vinyl chloride/vinyl acetate copolymer
  - (MPR-TSL, available from Nisshin Kagaku Co., Ltd.) 25 parts
- Dibutyloctylphthalate
  - (DOP, available from Daihachi Kagaku Co., Ltd.) 12 parts
- Surface active agent
  - (Megafack F-177P, available from Dainippon Ink & Chemicals Inc.) 4 parts
- Solvent
  - (Methyl ethyl ketone) 75 parts (Coating liquid for second image receiving layer)
- Butyral resin (Denka Butyral #2000-L, available from Denki Kagaku Kogyo K.K.) 16 parts
- Polymer compound (1) prepared above 4 parts
- Surface active agent
  - (Megafack F-177P, available from Dainippon Ink a Chemicals Inc.) 0.5 part
- Solvent (n-propyl alcohol) 200 parts The above coating liquid for first image receiving layer was coated on a polyethylene terephthalate film (thickness: 100 μm) using a whirler rotating at 300 rpm, and dried for 2 minutes in an oven of 100° C. to form a first image receiving layer (thickness: 20 μm) on the film.

Subsequently, the above coating liquid for second image receiving layer was coated on the first image receiving layer using a whirler rotating at 200 rpm, and dried for 2 minutes in an oven of 100° C. to form a second image receiving layer (thickness: 2 μm).

(2) Preparation of heat sensitive ink sheet

Figure 2:
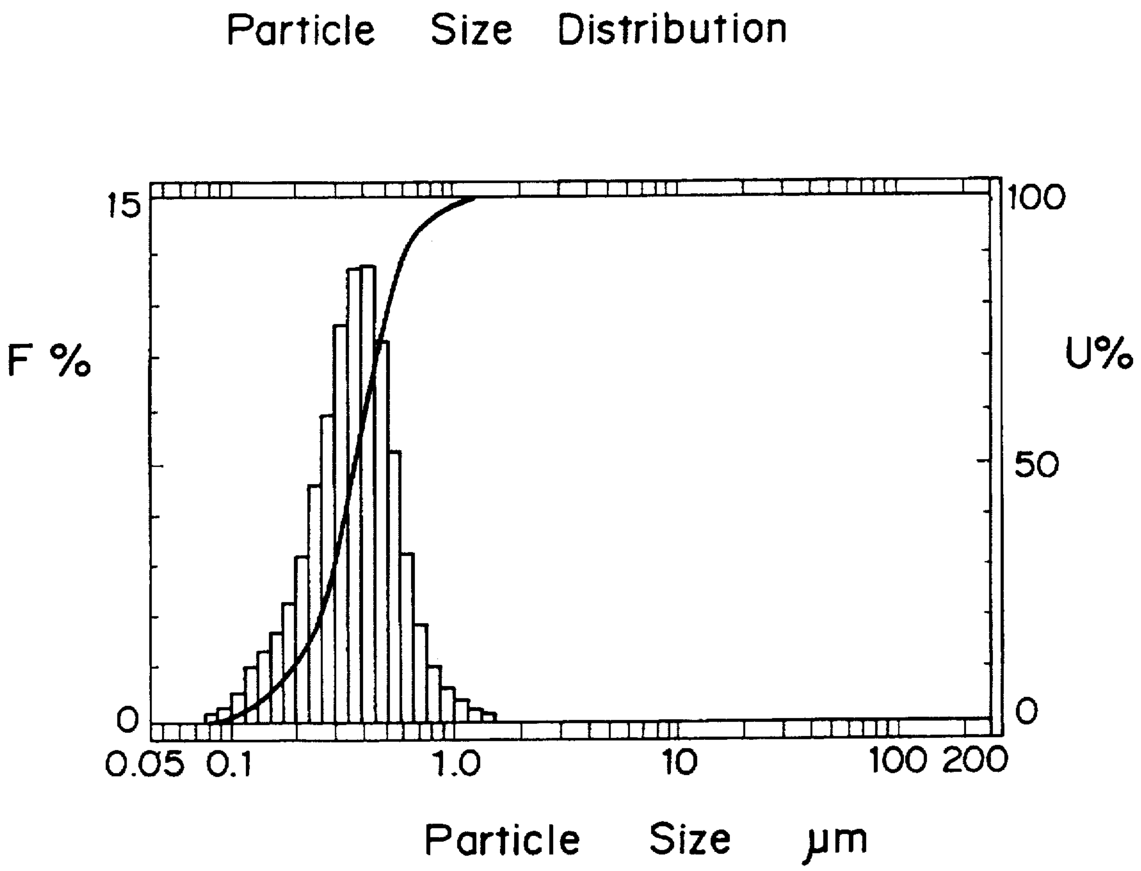
FIG. 2 shows a particle size distribution of magenta pigment employed in Example 1.

The following three pigment dispersions were prepared:

A) Cyan pigment dispersion
- Cyan Pigment (CI, P.B. 15:4) 12.0 parts
- Binder solution 122.8 parts B) Magenta pigment dispersion
- Magenta Pigment (CI, P.R. 57:1) 12.0 parts
- Binder solution 122.8 parts C) Yellow pigment dispersion
- Yellow Pigment (CI, P.Y. 14) 12.0 parts
- Binder solution 122.8 parts The binder solution comprised the following components:
- Butyral resin (softening point: 57° C.,
  - Denka Butyral #2000-L, available from Denki Kagaku Kogyo K.K.) 12.0 parts
- Solvent (n-propyl alcohol) 110.0 parts
- Dispersing agent (Solsparese S-20000, available from ICI Japan Co., Ltd.) 0.8 part The particle size distribution of the pigments in the dispersions are shown in the attached figures, wherein FIG. 1 indicates the distribution of cyan pigment; FIG. 2 indicates the distribution of magenta pigment; and FIG. 3 indicates the distribution of yellow pigment. In each figure, the axis of abscissas indicates particle size (μm), the left axis (F %) of ordinates indicates percentage (%) of particles of the indicated particle sizes, and the right axis (U %) of ordinates indicates accumulated percentage (%).

Figure 3:
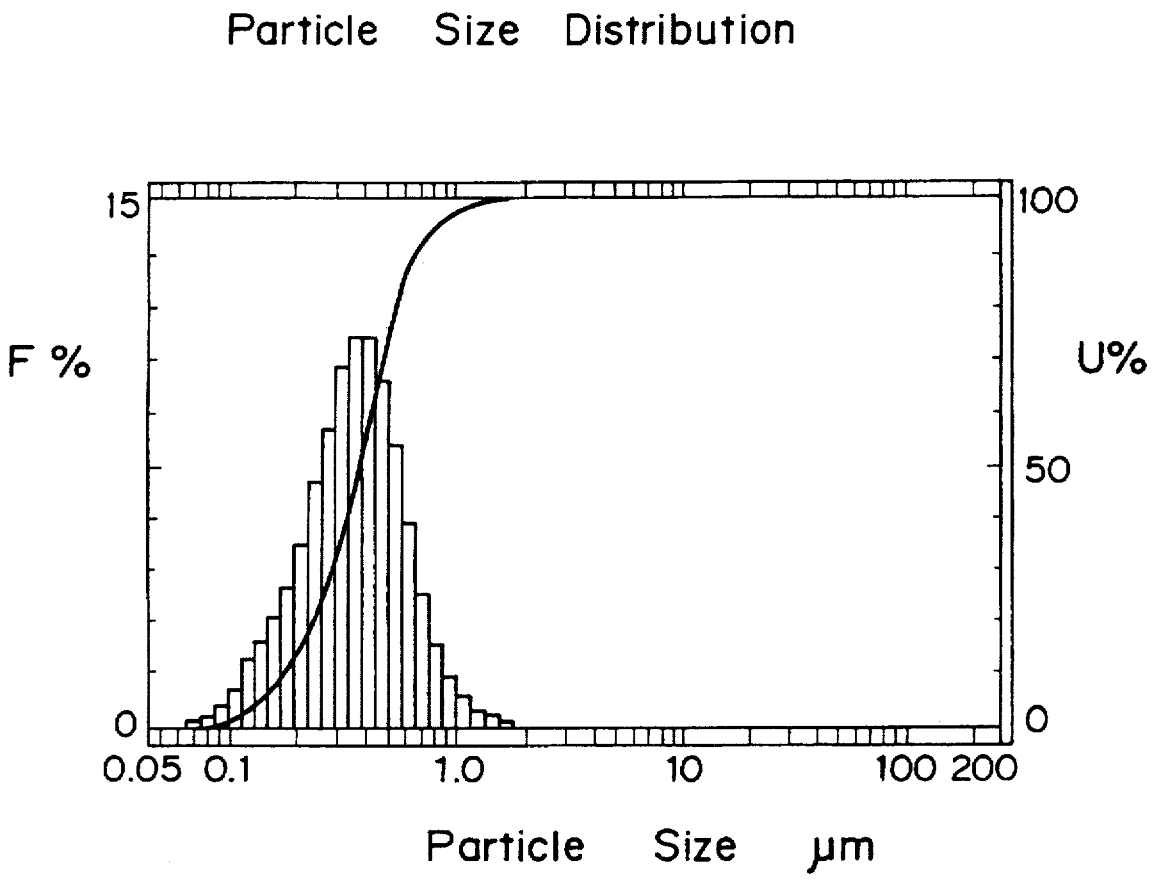
FIG. 3 shows a particle size distribution of yellow pigment employed in Example 1.

In FIG. 1, a meadian size of the particles is 0.154 μm, the specific surface is 422,354 $cm^2/cm^3$, and 90% of the total particels have particle sizes of not less than 0.252 μm. In FIG. 2, a meadian size of the particles is 0.365 μm, the specific surface is 189,370 $cm^2/cm^3$, and 90% of the total particels have particle sizes of not less than 0.599 μm. In FIG. 3, a meadian size of the particles is 0.364 μm, the specific surface is 193,350 $cm^2/cm^3$, and 90% of the total particels have particle sizes of not less than 0.655 μm.

To 10 parts of each pigment dispersion were added 0.24 part of stearic acid amide and 60 parts of n-propyl alcohol to give a coating liquid. Each of thus obtained coating liquids (A), B) and C) corresponding to the pigment dispersions A), B) and C)) was coated using a whirler on a polyester film (thickness: 5 μm, available from Teijin K.K.) with a back surface having been made easily releasable. Thus, a cyan ink sheet having a support and a cyan ink layer of 0.36 μm, a magenta ink sheet having a support and a magenta ink layer of 0.38 μm, and a yellow ink sheet having a support and a yellow ink layer of 0.42 μm, were prepared.

Initially, the cyan heat sensitive ink sheet was superposed on the image receiving sheet, and a thermal head was placed on the cyan ink sheet side for imagewise forming a cyan image by the known divided sub-scanning method. The divided sub-scanning method was performed with multiple modulation for giving area gradation by moving a thermal head of 75 μm×50 μm in one direction at a pitch of 3 μm along 50 μm length. The support (polyester film) of the cyan ink sheet was then peeled off from the image receiving sheet on which a cyan image with area gradation was maintained. On the image receiving sheet having the cyan image was superposed the magenta ink sheet, and the same procedure was repeated for forming a magenta image with area gradation on the image receiving sheet having the cyan image. The yellow ink sheet was then superposed on the image receiving sheet having the cyan and magenta images thereon in the same manner, and the same procedure was repeated for forming a yellow image with area gradation on the image receiving sheet. Thus, a multicolor image was formed on the image receiving layer.

Subsequently, an art paper sheet was placed on the image receiving sheet having the multicolor image, and they were passed through a couple of heat rollers under conditions of 130° C., 4.5 kg/cm and 4 m/sec. Then, the polyethylene terephthalate film of the image receiving sheet was peeled off from the art paper sheet to form a multicolor image having the second image receiving layer on the art paper sheet. Thus obtained multicolor image showed high approximation to that of chemical proof (Color Art, available from Fuji Photo Film Co., Ltd.) prepared from a lith manuscript.

The following is optical reflection density of a solid portion of each color image:

Cyan image: 1.54

Magenta image: 1.42

Yellow image 1.57

The optical reflection density on characters of 4 points which was measured by means of a microdensitometer was almost the same as above.

The gradation reproduction was observed in the range of 5 to 95%, and the obtained dot showed preferable shape (close to predetermied shape) and no defects.

Further, the multicolor image precisely followed unevenness of the art paper sheet to give a matted surface. Therefore, the surface gloss of the multicolor image showed extremely high approximation to that of print.

The results of these evaluation are set forth in Table 3.

EXAMPLE 2

[Synthetic example 2]

The procedures of Synthetic example 1 were repeated except for employing 39 parts of hexyl acrylate and 32 parts of acryloylmorpholine instead of 31.6 parts of butyl acrylate and 24.4 parts of N,N-dimethylacrylamide to 30 prepare polymer compound (2) set forth below.

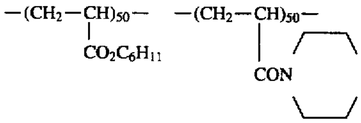

Polymer compound (2)

The above unit ratio is molar ratio.

The weight average molecular weight was 31,000 (in terms of polystyrene).

A multicolor image was prepared in the same manner as Example 1 using the heat sensitive ink sheets and the following image receiving sheet prepared in the same manner as Example 1.

(1) Preparation of image receiving sheet

The following coating liquids for first and second image receiving layers were prepared:

(Coating liquid for first image receiving layer)
Ethylene/ethyl acrylate copolymer
(EvaflexA-709, available from Mitsui Petrochemical Industries, Ltd.) 20 parts
Solvent
(Toluene) 100 parts (Coating liquid for second image receiving layer)
Butyral resin (Denka Butyral #2000-L, available from Denki Kagaku Kogyo K.K.) 16 parts
Polymer compound (2) prepared above 4 parts
Surface active agent
(Megafack F-177P, available from Dainippon Ink & Chemicals Inc.) 0.5 part
Solvent
(n-propyl alcohol) 200 parts The above coating liquid for first image receiving layer was coated on a polyethylene terephthalate film (thickness: 100 μm) using a whirler rotating at 300 rpm, and dried for 2 minutes in an oven of 100° C. to form a first image receiving layer (thickness: 20 μm) on the film.

Subsequently, the above coating liquid for second image receiving layer was coated on the first image receiving layer using a whirler rotating at 200 rpm, and dried for 2 minutes in an oven of 100° C. to form a second image receiving layer (thickness: 2 μm).

The resultant multicolor image was retransferred onto an art paper sheet in the same manner as Example 1.

Optical reflection density of a solid portion of each color image was the same as Example 1. The results of other evaluations are set forth in Table 3.

EXAMPLE 3

A multicolor image was prepared in the same manner as Example 1 except for preparing a coating liquid for the second image receiving layer by using the following polymer compound (3) instead of the polymer compound (1) prepared in the same manner as Example 1.

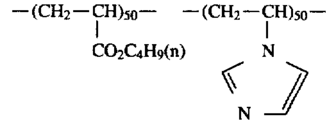

Polymer compound (3)

The above unit ratio is molar ratio.

The weight average molecular weight was 16,000 (in terms of polystyrene).

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 3.

EXAMPLE 4

A multicolor image was prepared in the same manner as Example 1 except for preparing a coating liquid for the second image receiving layer by further adding 1 part of the following additive (SP-200, available from Japan Catalytic Chemical Industry Co., Ltd.) to the liquid prepared in the same manner as Example 1.

Additive (structure having the following unit):

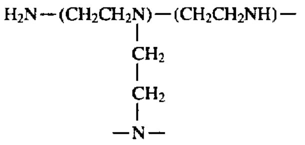

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 3.

EXAMPLE 5

A multicolor image was prepared in the same manner as Example 1 except for preparing a coating liquid for the first image receiving layer by changing the amount of the surface active agent (Megafack F-177P) from 4 parts to 0.01 part to the liquid prepared in the same manner as Example 1.

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 3.

EXAMPLE 6

A multicolor image was prepared in the same manner as Example 1 except for preparing a coating liquid for the second image receiving layer by using the following polymer compound (4) instead of the polymer compound (1) prepared in the same manner as Example 1.

Polymer compound (4)

Butyl methacrylate, N,N-dimethylacrylamide and N,N,N-(trihexyl)-N-(styrylmethyl)-ammonium chloride copolymer The molar ratio of butyl methacrylate and N,N-dimethylacrylamide and N,N,N-(trihexyl)-N-(styrylmethyl)ammonium chloride was 5:5:1.

The weight average molecular weight was 3,900 (in terms of polystyrene).

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 3.

EXAMPLE 7

A multicolor image was prepared in the same manner as Example 1 except for preparing a coating liquid for the second image receiving layer by using the following polymer compound (5) instead of the polymer compound (1) prepared in the same manner as Example 1.

Polymer compound (5)

Butyl methacrylate, N,N-dimethylacrylamide and N,N,N-(trioctyl)-N-(styrylmethyl)-ammonium chloride copolymer The molar ratio of butyl methacrylate and N,N-dimethylacrylamide and N,N,N-(trioctyl)-N-(styrylmethyl)ammonium chloride was 5:5:1.

The weight average molecular weight was 5,400 (in terms of polystyrene).

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 3.

EXAMPLE 8

A multicolor image was prepared in the same manner as Example 1 except for preparing a coating liquid for the second image receiving layer by using the following polymer compound (6) instead of the polymer compound (1) prepared in the same manner as Example 1.

Polymer compound (6)

N,N,N-(hexyl)-N-(styrylmethyl)-ammonium chloride homopolymer

The weight average molecular weight was 3,800 (in terms of polystyrene).

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 3.

EXAMPLE 9

A multicolor image was prepared in the same manner as Example 1 except for preparing a coating liquid for the first image receiving layer by using hexafunctional acrylate monomer (M.W.=1947, DPCA-120, available from Nippon Kayaku Co., Ltd.) instead of DOP prepared in the same manner as Example 1.

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

The results of other evaluations are set forth in Table 3.

Comparison Example 1

A multicolor image was prepared in the same manner as Example 1 except for preparing a coating liquid for the second image receiving layer with no use of the polymer compound (1) prepared in the same manner as Example 1.

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

The results of other evaluations are set forth in Table 3.

Comparison Example 2

A multicolor image was prepared in the same manner as Example 1 except for preparing a coating liquid for the second image receiving layer by using phenol resin (PR-51600B, available from Sumitomo Dulles Co., Ltd.) instead of the polymer compound (1) prepared in the same manner as Example 1.

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

The results of other evaluations are set forth in Table 3.

Comparison Example 3

A multicolor image was prepared in the same manner as Example 1 except for preparing a coating liquid for the second image receiving layer by using rosin (hydrogenation 10 rosin, KR-610, available from Arakawa Chemical Industry Co., Ltd.) instead of the polymer compound (1) prepared in the same manner as Example 1.

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

The results of other evaluations are set forth in Table 3.

Comparison Example 4

A multicolor image was prepared in the same manner as Example 1 except for preparing a coating liquid for the second image receiving layer by using nylon (Daiamide X-1874, available from Daicel Co., Ltd.) instead of the polymer compound (1) prepared in the same manner as Example 1.

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

The results of other evaluations are set forth in Table 3.

As for the multicolor images obtained in Examples 1 to and Comparison Examples 1 to 4, the evaluations of shape of dot, gradation reproduction, tackiness, sticking (sticking on other material such as another sheet) and defect by dust were ranked based on evaluation of color image obtained in Comparison Example 1 as follows:

(Shape of dot)
- AA: Sufficiently satisfactory compared with dot forming multicolor image of Comparison Example 1
- BB: Satisfactory compared with dot forming multicolor image of Comparison Example 1
- CC: the same as dot forming multicolor image of Comparison Example 1
- DD: Poor compared with dot forming multicolor image of Comparison Example 1

(Reproduction of gradation)
- AA: Excellent compared with multicolor image of Comparison Example 1
- BB: Good compared with multicolor image of Comparison Example 1
- CC: The same as multicolor image of Comparison Example 1
- DD: Poor compared with multicolor image of Comparison Example 1

(Tackiness)
- AA: Excellent compared with multicolor image of Comparison Example 1
- BB: Good which is the same as multicolor image of Comparison Example 1
- CC: Poor compared with multicolor image of Comparison Example 1
- DD: Extremely poor compared with multicolor image of Comparison Example 1

(Sticking)
- AA: Excellent compared with multicolor image of Comparison Example 1
- BB: Good which is the same as multicolor image of Comparison Example 1
- CC: Poor compared with multicolor image of Comparison Example 1
- DD: Extremely poor compared with multicolor image of Comparison Example 1

(Defect of dust)

The number of defects by dust in an area of A4 size (210 mm×297 mm) of the multicolor image was counted.

TABLE 3

| | Polymer Compound No. | Shape of Dot | Reproductivity of Gradation | Tackiness | Sticking | Defect by Dust |
|---|---|---|---|---|---|---|
| Ex. 1 | 1 | BB | BB | BB | BB | 10 |
| Ex. 2 | 2 | BB | BB | BB | BB | 6 |
| Ex. 3 | 3 | BB | BB | BB | BB | 9 |
| Ex. 4 | 1 | AA | BB | BB | BB | 11 |
| Ex. 5 | 1 | AA | BB | BB | BB | 9 |
| Ex. 6 | 4 | AA | BB | BB | BB | 6 |
| Ex. 7 | 5 | AA | BB | BB | BB | 6 |
| Ex. 8 | 6 | AA | BB | BB | BB | 9 |
| Ex. 9 | 1 | AA | AA | AA | BB | 2 |
| Co. Ex. 1 | — | CC | CC | BB | BB | 9 |
| Co. Ex. 2 | Phenol | DD | DD | DD | DD | 70 |
| Co. Ex. 3 | Rosin | CC | DD | CC | CC | 50 |
| Co. Ex. 4 | Nylon | CC | CC | CC | CC | 60 |

Further, As for the first image receiving layer of Example 9, Young's modulus was measured at room temperature. The resultant value was 80 kg·f/cm$^2$

EXAMPLE 10

Heat sensitive ink sheets and an image receiving sheet were prepared below. Then, a composite of a heat sensitive sheet and an image receiving sheet was irradiated with a laser beam to form a transferred image in the following manner.

(1) Preparation of heat sensitive ink sheet

1) Preparation of coating liquid for light-heat conversion layer

The following components were mixed using a stirrer to prepare a coating liquid for light-heat conversion layer:

Preparation of mother liquor

Carbon black (Mitsubishi Carbon Black MA-100, C.I.Pigment Black 7, available from Miysubishi Chemical Industries Ltd.) 20 parts 30% aqueous solution of Johncryl J-62 (available from Johnson Polymer Co., Ltd.) 6 parts Ion exchanged water 80 parts Isopropyl alcohol 20 parts Glass beads 100 parts The above components were dispersed with a paint shaker (available from Toyo Seiki Co., Ltd.) for 2 hours to prepare a mother liquor of forming a light-heat conversion layer.

Preparation of coating liquid

Mother liquor prepared above 100 parts

Polyvinyl alcohol (#205, available from Kuraray Co., Ltd.) 3 parts

Isopropyl alcohol 100 parts

Ion exchanged water 450 parts

The above components were mixed with a stirrer to prepare a coating liquid for forming a light-heat conversion layer.

2) Formation of light-heat conversion layer

A first subbing layer comprising styrene/butadiene copolymer (thickness: 0.5 μm) and a second subbing layer comprising gelatin (thickness: 0.1 μm) were formed on a polyethylene terephthalate film (thickness: 75 μm) in order. Then, the above coating liquid for light-heat conversion layer was coated on the second subbing layer using a whirler, and dried for 2 minutes in an oven of 100° C. to form a light-heat conversion layer (thickness: 0.3 μm (measured by feeler-type thickness meter and scanning-type electron microscope), absorption of light of 488 nm: 90%).

3) Preparation of coating liquid for heat sensitive peeling layer

The following components were mixed using a stirrer to prepare a coating liquid for heat sensitive peeling layer:

Nitrocellulose (RS1/2, available from Daicel Co., Ltd.) 1 part

Methyl ethyl ketone 100 parts

Propylene glycol monomethylether acetate 20 parts

4) Formation of heat sensitive peeling layer

The above coating liquid for heat sensitive peeling layer was coated on the light-heat conversion layer using a whirler, and dried for 2 minutes in an oven of 100° C. to form a heat sensitive peeling layer (thickness: 0.1 μm (measured by feeler-type thickness meter a layer formed by coating the liquid on a polyester film having an even surface in the same manner as above)).

5) Preparation of coating liquid for heat sensitive ink layer (image forming layer) of magenta The following components were mixed using a stirrer to prepare a coating liquid for heat sensitive ink layer of magenta:

Preparation of mother liquor 20 weight % n-propyl alcohol solution of polyvinyl butyral (Denka Butyral #2000-L available from Denki Kagaku Kogyo K.K.) 63 parts Magenta pigments (Rionole Red 6B4290G, C.I.P.R.57:1, available from Toyo Ink Mfg, Co., Ltd.) 12 parts Dispersing agent (Solspers S-20000, available from ICI Japan Co., Ltd.) 0.8 part n-Propyl alcohol 60 parts Glass beads 100 parts The above materials were placed in a paint shaker (available from Toyo Seiki Co., Ltd.) and were subjected to dispersing treatment for two hours to prepare the mother liquor.

Preparation of coating liquid

Mother liquor prepared above 10 parts n-Propyl alcohol 60 parts

Surface active agent (Megafack F-177PF, available from Dainippon Ink & Chemicals Inc.) 0.05 part The above components were mixed with a stirrer to prepare a coating liquid for forming a heat sensitive ink layer of magenta image.

6) Formation of heat sensitive ink layer of magenta

The above coating liquid for heat sensitive ink layer of magenta image was coated on the heat sensitive peeling layer using a whirler, and dried for 2 minutes in an oven of 100° C. to form a heat sensitive ink layer (thickness: 0.3 μm (measured by feeler-type thickness meter and scanning-type electron microscope a layer formed by coating the liquid on a plain surface of a polyester film (thickness: 100 μm) in the same manner as above). The obtained ink layer showed optical transmission density of 0.7 (measured by Macbeth densitometer using green filter).

Thus, a heat sensitive ink sheet (magenta image) composed of a support, a light-heat conversion layer, a heat sensitive peeling layer and heat sensitive ink layer of magenta, was prepared.

(2) Preparation of image receiving sheet

The image receiving sheet was prepared in the same manner as Example 1.

(3) Preparation of composite for forming image

The above heat sensitive ink sheet and the above image receiving sheet were placed at room temperature in such a manner that the heat sensitive ink and the second image receiving layer came into contact with each other and passed through a couple of heat rollers under conditions of 70° C., 4.5 kg/cm and 2 m/minutes to form a composite. The pressure (4.5 kg/cm) was measured at room temperature by employing a pressure sensitive color-developing material for measuring pressure (Prescale, available from Fuji Photo Film Co., Ltd.).

(4) Fixation of composite on image forming device

The above composite was wound around a rotating drum provided with a number of suction holes in such a manner that the image receiving sheet was in contact with a surface of the rotating drum, and the composite was fixed on the rotating drum by sucking inside of the drum.

(5) Image recording

The laser beam (λ:830 nm, out-put power:100 mW) was focused at a beam diameter of 8 μm on the surface of the light-heat conversion layer of the composite to record a image (line), while, by rotating the drum, the laser beam was moved in the direction (sub-scanning direction) perpendicular to the rotating direction (main-scanning direction).

Main-scanning rate: 8 m/sec.

Sub-scanning pitch (Sub-scanning amount per one time): 5 μm (6) Formation of transferred image The recorded composite was removed from the drum, and the heat sensitive ink sheet was peeled off from the image receiving sheet to obtain the image receiving sheet having the transferred image (lines) which were formed in only the irradiation portion of the laser beam.

Further, the transferred image was observed by a light microscope. The image had dot of 200 lines/inch in the range of 3 to 98%. The shape was satisfactory.

(7) Formation of retransferred image

The obtained image receiving sheet having the transferred magenta image was superposed on an art paper sheet to form a retransferred magenta image on the art paper sheet in the same manner as Example 1.

The magenta image had no tackiness and sticking.

EXAMPLE 11

A color image was prepared in the same manner as Example 10 except for preparing a coating liquid for the second image receiving layer by using the polymer compound (2) used in Example 2 instead of the polymer compound (1) prepared in the same manner as Example 10.

A color image was prepared in the same manner as Example 10 using the heat sensitive ink sheet and the image receiving sheet prepared in the same manner as Example 10. The transferred image was observed by a light microscope, and it was confirmed that the image had dot of 200 lines/inch in the range of 4 to 96%. The shape was also satisfactory.

EXAMPLE 12

A color image was prepared in the same manner as Example 1 except for preparing a coating liquid for the second image receiving layer by using the polymer compound (4) use in Example 6 instead of the polymer compound (1) prepared in the same manner as Example 10.

A color image was prepared in the same manner as Example 10 using the heat sensitive ink sheet and the image receiving sheet prepared in the same manner as Example 10. The transferred image was observed by a light microscope, and it was confirmed that the image had dot of 200 lines/inch in the range of 4 to 96%. The shape was also satisfactory.

Comparison Example 5

A color image was prepared in the same manner as Example 10 except for preparing a coating liquid for the second image receiving layer with no use of the polymer compound (1) prepared in the same manner as Example 10.

A color image was prepared in the same manner as Example 10 using the heat sensitive ink sheet and the image receiving sheet prepared in the same manner as Example 10. The transferred image was observed by a light microscope, and it was confirmed that the image reproduced dots having 200 lines/inch in the range of 8 to 92%.

(8) Evaluation

As for the color images, shape of dot and reproductivity of the dot were evaluated above. The shape of dot is ranked based on evaluation of color image obtained in Comparison Example 5, as follows:

(Shape of dot)

BB: Satisfactory compared with dot forming multicolor image of Comparison Example 5

CC: The same as dot forming multicolor image of Comparison Example 5

The results of the evaluations are set forth in Table 4.

TABLE 4

| | Polymer Compound No. | Shape of Dot | Reproductivity of Dots |
|---|---|---|---|
| Ex. 10 | 1 | BB | 3-98 |
| Ex. 11 | 2 | BB | 4-96 |
| Ex. 12 | 4 | BB | 4-96 |
| Comp. Ex. 5 | — | CC | 8-92 |

We claim:

1. An image receiving sheet comprising a support sheet, a first image receiving layer thereon and a second image receiving layer provided on the first image receiving layer;

wherein said first image receiving layer has a thickness of 5 to 30 μm and Young's modulus of 10 to 10,000 kg·f/$cm^2$ and the second image receiving layer has a thickness of 0.5 to 5 μm and comprises butyral resin and polymer having at least one of recurring units represented by the following Formula (I):

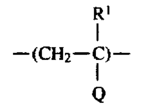

(I)

wherein $R^1$ represents a hydrogen atom or a methyl group; and

Q represents:

—$CONR^2R^3$, in which each of $R^2$ and $R^3$ independently represents a hydrogen atom, an alkyl group of 1 to 18 carbon atoms, an alkyl group of 1 to 18 carbon atoms which is substituted with at least one group or atom selected from the group consisting of hydroxyl, alkoxy of 1 to 6 carbon atoms, acetamide, halogen and cyano, an aryl group of 6 to 20 carbon atoms, an aryl group of 6 to 20 carbon atoms which is substituted with at least one group or atom selected from the group consisting of hydroxyl, alkoxy of 1 to 6 carbon atoms, halogen and cyano, an acyl group of 2 to 6 carbon atoms, a phenylsulfonyl group, a phenylsulfonyl group which is substituted with alkyl of 1 to 6 carbon atoms; or $R^2$ and $R^3$ is combined together with the nitrogen atom to form a 5–7 membered heterocyclic group;

a nitrogen-containing heterocyclic group; or a group having the Formula (II):

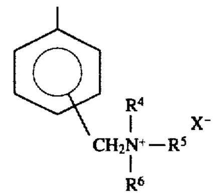

(II)

in which each of $R^4$, $R^5$ and $R^6$ independently represents an alkyl group of 1 to 25 carbon atoms, an alkyl group of 1 to 25 carbon atoms which is substituted with at least one group or atom selected from the group consisting of hydroxyl, alkoxy of 1 to 6 carbon atoms, halogen and cyano, an aralkyl group of 7 to 25 carbon atoms, an aralkyl group of 7 to 25 carbon atoms which is substituted with at least one group or atom selected from the group consisting of hydroxyl, alkoxy of 1 to 6 carbon atoms, halogen and cyano, an aryl group of 6 to 25 carbon atoms, or an aryl group of 6 to 25 carbon atoms which is substituted with at least one group or atom selected from the group consisting of hydroxyl, alkoxy of 1 to 6 carbon atoms, halogen and cyano; and $X^-$ represents $Cl^-$, $Br^-$ or $I^-$;

said polymer having at least one of recurring units represented by the Formula (I) being contained in the second image receiving layer in an amount of 5 to 50 weight % based on the total amount of polymers of the second image receiving layer.

2. The image receiving sheet as defined in claim 1, wherein the nitrogen-containing heterocyclic group represents an imidazolyl group, an imidazolyl group which is substituted with at least one group or atom selected from the group consisting of alkyl of 1 to 5 carbon atoms, aryl of 6 to 10 carbon atoms, halogen and cyano, a pyrrolidinyl group, a pyrrolidinyl group which is substituted with at least one group or atom selected from the group consisting of alkyl of 1 to 5 carbon atoms, aryl of 6 to 10 carbon atoms, halogen and cyano, a pyridyl group, a pyridyl group which is substituted with at least one group or atom selected from the group consisting of alkyl of 1 to 5 carbon atoms, aryl of 6 to 10 carbon atoms, halogen and cyano, a carbazolyl group, a carbazolyl group which is substituted with at least one group or atom selected from the group consisting of alkyl of 1 to 5 carbon atoms, aryl of 6 to 10 carbon atoms, halogen and cyano, a triazolyl group or a triazolyl group which is substituted with at least one group or atom selected from the group consisting of alkyl of 1 to 5 carbon atoms, aryl of 6 to 10 carbon atoms, halogen and cyano.

3. The image receiving sheet as defined in claim 1, wherein each of $R^2$ and $R^3$ of —$CONR^2R^3$ independently represents a hydrogen atom, an alkyl group of 1 to 10 carbon atom, an alkyl group of 1 to 10 carbon atom which is substituted with hydroxyl, acetamide, or alkoxy of 1 to 6 carbon atoms, an aryl group of 6 to 15 carbon atoms, or an aryl group of 6 to 15 carbon atoms which is substituted with hydroxy or alkoxy of 1 to 6 carbon atoms, an acyl group of 2 to 6 carbon atoms, a phenylsulfonyl group, a phenylsulfonyl group which is substituted with alkyl of 1 to 6 carbon atoms.

4. The image receiving sheet as defined in claim 1, wherein the nitrogen-containing heterocyclic group represents an imidazolyl group, an imidazolyl group which is substituted with at least one of alkyl groups of 1 to 5 carbon atoms, or an triazolyl group which is substituted with at least one of alkyl groups of 1 to 5 carbon atoms.

5. The image receiving sheet as defined in claim 1, wherein each of $R^6$, $R^7$ and $R^8$ of the formula (II) independently represents an alkyl group of 1 to 20 carbon atom, an alkyl group of 1 to 20 carbon atom which is substituted with at least one group selected from alkoxy of 1 to 6 carbon atom, halogen and cyano, an aralkyl group of 7 to 18 carbon atom, an aralkyl group of 7 to 18 carbon atoms which is substituted with at least one group selected from alkoxy of 1 to 6 carbon atom, halogen and cyano, an aryl group of 6 to 20 carbon atoms, or an aryl group of 6 to 20 carbon atoms which is substituted with at least one group selected from alkoxy of 1 to 6 carbon atom, halogen and cyano; and $X^-$ represents $Cl^-$, $Br^-$ or $I^-$.

6. The image receiving sheet as defined in claim 1, wherein the first image receiving layer contains plasticizer having molecular weight of not less than 1,000.

7. The image receiving sheet as defined in claim 1, wherein Q represents —$CONR^2R^3$.

8. A composite wherein the image receiving sheet defined in claim 1 is superposed on a heat sensitive ink sheet which comprises a support sheet and a heat sensitive ink layer having a thickness of 0.2 to 1.0 μm which is formed of a heat sensitive ink material comprising 30 to 70 weight % of colored pigment, 25 to 60 weight % of an amorphous organic polymer having a softening point of 40° to 150° C., such that the second image receiving layer of the image receiving sheet is in contact with the heat sensitive ink layer.

9. An image forming method which comprises the steps of:

superposing the heat sensitive ink sheet comprising a support sheet and a heat sensitive ink layer thereon formed of heat sensitive ink material on the second image receiving layer of the image receiving sheet of claim 1;

placing imagewise a thermal head on the support of the heat sensitive ink sheet to form an image of the ink material with area gradation on the image receiving sheet;

separating the support of the heat sensitive ink sheet from the image receiving sheet so that the image of the ink material is retained on the second image receiving layer;

superposing the image receiving sheet on a white paper sheet in such a manner that the image of the ink material is in contact with a surface of the white paper sheet; and separating the image receiving sheet from the white paper sheet, keeping the image of the ink material having the second image receiving layer on the white paper sheet, said image of the ink material on the white paper sheet having an optical reflection density of at least 1.0.

10. An image forming method which comprises the steps of:

superposing the heat sensitive ink sheet comprising a support sheet and a heat sensitive ink layer thereon formed of heat sensitive ink material on the second image receiving layer of the image receiving sheet of claim 1;

irradiating a laser beam modulated by digital signals on the heat sensitive ink layer through the support of the heat sensitive ink sheet to form an image of the ink material on the image receiving sheet;

separating the support of the heat sensitive ink sheet from the image receiving sheet so that the image of the heat sensitive ink material is retained on the second image receiving layer;

superposing the image receiving sheet on a white paper sheet in such a manner that the image of the ink material is in contact with a surface of the white paper sheet; and separating the image receiving sheet from the white paper sheet, keeping the image of the ink material having the second image receiving layer onto the white paper sheet, said image of the ink material on the white paper sheet having an optical reflection density of at least 1.0.

11. The thermal transfer recording method as defined in claim 10, wherein the formation of the image of the ink material on the image receiving sheet is done through ablation of the image from the support of the heat sensitive ink sheet.

12. The image receiving sheet as defined in claim 1, wherein Q is the group represented by Formula (II).

* * * * *